| United States Patent [19] | [11] Patent Number: 4,600,671 |
| Saitoh et al. | [45] Date of Patent: Jul. 15, 1986 |

[54] PHOTOCONDUCTIVE MEMBER HAVING LIGHT RECEIVING LAYER OF A-(SI-GE) AND N

[75] Inventors: Keishi Saitoh, Ibaraki; Yukihiko Ohnuki, Kawasaki; Shigeru Ohno, Yokohama, all of Japan

[73] Assignee: Canon Kabushiki Kaisha, Tokyo, Japan

[21] Appl. No.: 648,267

[22] Filed: Sep. 7, 1984

[30] Foreign Application Priority Data

Sep. 12, 1983 [JP] Japan ................. 58-168545
Sep. 13, 1983 [JP] Japan ................. 58-170381
Dec. 27, 1983 [JP] Japan ................. 58-244736
Dec. 27, 1983 [JP] Japan ................. 58-244740
Dec. 28, 1983 [JP] Japan ................. 58-245303
Dec. 28, 1983 [JP] Japan ................. 58-245315

[51] Int. Cl.$^4$ ............................................. G03G 5/082
[52] U.S. Cl. ................................. 430/57; 430/60; 430/69; 430/84; 430/95
[58] Field of Search .............. 430/57, 60, 69, 84, 430/95

[56] References Cited

U.S. PATENT DOCUMENTS 4,451,546  5/1984  Kawamura et al. ............ 430/57
4,490,450 12/1984  Shimizu et al. ................ 430/57
4,491,626  1/1985  Kawamura et al. ............ 430/57

*Primary Examiner*—John L. Goodrow
*Attorney, Agent, or Firm*—Fitzpatrick, Cella, Harper & Scinto

[57] ABSTRACT

A photoconductive member comprises a substrate for the photoconductive member and a light receiving layer exhibiting photoconductivity provided on said substrate comprising an amorphous material containing silicon atoms and germanium atoms, the light receiving layer having a layer region (N) containing nitrogen atoms, and the layer region (N) having a region (X) in which the content C (N) of nitrogen atoms in the layer thickness direction smoothly and continuously increases toward the upper surface of the light receiving layer.

166 Claims, 24 Drawing Figures

PHOTOCONDUCTIVE MEMBER HAVING LIGHT RECEIVING LAYER OF A-(SI-GE) AND N

BACKGROUND OF THE INVENTION

1. Field of the Invention

This invention relates to a photoconductive member having sensitivity to electromagnetic waves such as light (herein used in a broad sense, including ultraviolet rays, visible light, infrared rays, X-rays, gamma-rays, and the like).

2. Description of the Prior Art

Photoconductive materials, which constitute photoconductive layers in solid state image pickup devices, image forming members for electrophotography in the field of image formation, or manuscript reading devices and the like, are required to have a high sensitivity, a high SN ratio [photocurrent $(I_p)$/dark current $(I_d)$], spectral characteristics matching to those of irradiating electromagnetic waves, a rapid response to light, a desired dark resistance value as well as no harm to human bodies during usage. Further, in a solid state image pick-up device, it is also required that the residual image should easily be treated within a predetermined time. Particularly, when an image forming member for electrophotography is assembled in an electrophotographic device as an office apparatus, said safely characteristic is very important.

Under these circumstances, amorphous silicon (hereinafter referred to as "a-Si") has recently attracted attention as a photoconductive material. For example, German OLS Nos. 2746967 and 2855718 disclose applications of a-Si to image forming members for electrophotography, and German OLS No. 2933411 discloses an application of a-Si to a photoelectric transducing reading device.

However, under the present situation, the photoconductive members of the prior art having photoconductive layers made of a-Si still require further improvement in a balance of overall characteristics including electrical, optical and photoconductive characteristics such as dark resistance value, photosensitivity and response to light, etc., and service environmental characteristics such as humidity resistance, and a longer stability.

For instance, when said photoconductive member is applied to an image forming member for electrophotography, residual potential frequently remains on it during the service time if a higher photosensitivity and a higher dark resistance are made at the same time. When such a photoconductive member is repeatedly used for a long time, various inconveniences often appear, such as accumulation of fatigues by repeated uses or so called ghost phenomenon wherein residual images are formed, or when the photoconductive member is used repeatedly at a high speed, the response is gradually lowered.

Further, a-Si has a relatively smaller coefficient of absorption of the longer wavelength light in the visible light region as compared with the shorter wavelength light. Accordingly, in the matching to the semiconductor laser now practically used, the longer wavelength light cannot effectively be utilized, when the ordinary halogen lamp or fluorescent lamp is used as the light source. Thus, there still remain various points to be improved.

On the other hand, when the irradiation light is not sufficiently absorbed in the photoconductive layer, but when the amount of the light reaching the substrate is increased, interference due to multiple reflection may occur in the photoconductive layer to cause an "unfocused" image, in the case that the substrate itself has a high reflectance to the light transmitted through the photoconductive layer.

This effect will be increased, if the irradiated spot is made smaller to enhance resolution. Thus, this will be a great problem when a semiconductor laser is used as the light source.

Further, a-Si materials for the photoconductive layer may contain as the constituent atoms hydrogen atoms or halogen atoms such as fluorine atoms, chlorine atoms, etc. for improving their electrical, photoconductive characteristics; boron atoms, phosphorus atoms, etc. for controlling the electroconduction type as well as other atoms for improving other characteristics. The manner in which these constituent atoms exist therein may sometimes raise problems of electrical or photoconductive characteristics of the formed layer.

In many cases, for example, the life of the photocarriers generated by light irradiation in the formed photoconductive layer is not sufficiently long, or the charges injected from the substrate side cannot be sufficiently prevented at the dark portion.

Furthermore, in the case that the layer thickness exceeds ten and more $\mu$, there often appear, with the lapse of time, such phenomena as floating or peeling of the layer from the substrate surface or cracking in the layer, when the layer is taken out of a vacuum the position chamber for forming the layer and left standing in the air. Such phenomena often appear especially in the case of drum-like substrates used in the field of electrophotography, and thus there still remain problems to be solved with respect to a longer stability.

Accordingly, together with an attempt to improve the characteristics of a-Si material itself, it is also required to overcome all the problems as mentioned above in designing of the photoconductive member at the same time.

The present invention is based results of extensive studies made comprehensively from the standpoints of applicability and utility of a-Si as a photoconductive member for image forming members for electrophotography, solid state image pick-up devices, reading devices, etc. It has now been found that a photoconductive member having a photoconductive light receiving layer, made of an amorphous material containing at least one of hydrogen atoms (H) and halogen atoms (X) in a matrix of silicon atoms (Si) and germanium atoms (Ge), such as so called hydrogenated amorphous silicon germanium, halogenated amorphous silicon germanium, or halogen-containing hydrogenated amorphous silicon germanium [hereinafter generally referred to as a-SiGe(H,X)], said photoconductive member being prepared with a design to have a specific structure, as will be hereinafter described, not only exhibits practically extremely excellent characteristics but also surpasses the photoconductive members of the prior art in substantially all respects, and especially has markedly excellent characteristics as a photoconductive member for electrophotography and also excellent absorption spectrum characteristics on the longer wavelength side.

SUMMARY OF THE INVENTION

A primary object of the present invention is to provide a photoconductive member having constantly stable electrical, optical and photoconductive characteristics which is of all-environment type with virtually no dependence on the service environments, and which is markedly excellent in photosensitive characteristics on the longer wavelength side and light fatigue resistance, and also excellent in durability without any deterioration when repeatedly used, and with no or substantially no residual potential.

Another object of the present invention is to provide a photoconductive member which has a high photosensitivity throughout the whole visible light region, and a particularly excellent matching to a semiconductor laser and also a rapid response to light.

Other object of the present invention is to provide a photoconductive member having a good adhesion between a substrate and a layer formed on the substrate or between overlaid layers, a dense and stable structural constitution and a high layer quality.

Still other object of the present invention is to provide a photoconductive member which has a sufficient charge retentivity during the charging treatment for formation of electrostatic images, when used as an image forming member for electrophotography, to such an extent that the conventional electrophotographic method is very effectively applicable and which has a distinguished electrophotographic characteristic which is not substantially lowered even in a humid atmosphere.

Further object of the present invention is to provide a photoconductive member for electrophotography, which can easily provide an image of high quality, that is, a high density, a clear halftone, a high resolution and being free from "unfocused" image.

Still further object of the present invention is to provide a photoconductive member having a high photosensitivity a high SN ratio characteristic, and a good electrical contact with the substrate.

According to one aspect of the present invention, there is provided a photoconductive member which comprises a substrate for the photoconductive member and a light receiving layer exhibiting photoconductivity comprising an amorphous material containing silicon atoms and germanium atoms, the light receiving layer having a layer region (N) containing nitrogen atoms, the layer region (N) having a region (X) with a smooth content curve of nitrogen atoms distributed in the layer thickness direction, the content curve continuously increasing toward the upper surface of the light receiving layer.

According to another aspect of the present invention, there is provided a photoconductive member which comprises a substrate for the photoconductive member and a light receiving layer having a layer constitution comprising a first layer region (G) comprising an amorphous material containing germanium atoms and, if necessary, at least one of silicon atoms, hydrogen atoms, and halogen atoms (X) [hereinafter referred to as "a-Ge(Si,H,X)"] and a second layer region (S) exhibiting photoconductivity comprising an amorphous material containing silicon atoms and, if necessary, at least one of hydrogen atoms and halogen atoms (X) [hereinafter referred to as "a-Si(H,X)"], the first layer region and the second layer region being provided successively in this order from the substrate side, the light receiving layer having a layer region (N) containing nitrogen atoms and a region (X) with a smooth content curve of nitrogen atoms distributed in the layer thickness direction in the layer region (N), the content curve continuously increasing toward the upper surface of the light receiving layer.

DETAILED DESCRIPTION OF THE PREFERRED EMBODIMENTS

Figure 1:
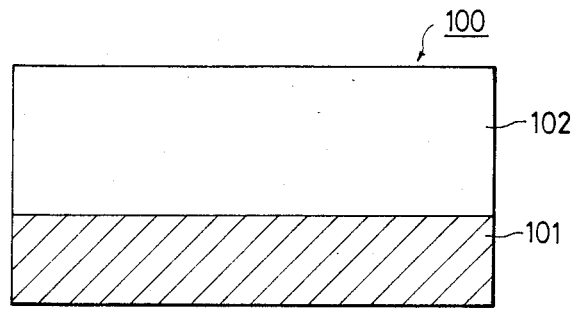
FIGS. 1, 14, 15 and 20 each shows a schematic sectional view for illustration of the layer constitution of the photoconductive member according to the present invention.

Referring now to the drawings, the photoconductive members according to the present invention will be described in detail below.

FIG. 1 shows a schematic sectional view for illustration of the layer constitution of a first embodiment of the photoconductive member of the present invention.

The photoconductive member 100 as shown in FIG. 1 has a photoconductive light receiving layer 102, comprising a-SiGe(H,X), on a substrate 101 for the photoconductive member, and the light receiving layer 102 has a layer region (N) containing nitrogen atoms.

The germanium atoms existing in the light receiving layer 102 may be uniformly distributed without exception in the layer 102 or may be distributed without exception in the layer thickness direction but not uniformly in the content of germanium atoms in depth profile. In any case, however, it is necessary that the germanium atoms are distributed uniformly and contained without exception in the interplanar direction, i.e. the direction in parallel to the substrate surface, to make the characteristics uniform in the interplanar direction. The germanium atoms are particularly so contained in the light receiving layer 102 that they should be contained without exception in the layer thickness direction of the light receiving layer 102 and should be more distributed toward the substrate side (i.e. the side of interface between the light receiving layer 102 and the substrate 101) than the side opposite to the substrate 101—provided side (that is, the surface 103 side of light receiving layer 102), or they should take quite a reversed depth profile.

In the photoconductive member shown in FIG. 1, it is desirable that the germanium atoms existing in said light receiving layer can take said depth profile in the layer thickness direction and a uniform distribution state in the interplanar direction in parallel to the substrate surface.

FIGS. 2 through 10 each shows typical examples of nonuniform depth profile in the layer thickness direction of germanium atoms in the light receiving layer of the photoconductive member shown in FIG. 1.

In FIGS. 2 through 10, the abscissa indicates the content C of germanium atoms and the ordinate the layer thickness of the photoconductive light receiving layer, $t_B$ showing the position of the surface of the light receiving layer on the substrate side and $t_T$ the position of the surface of the light receiving layer on the side opposite to the substrate side. That is, layer formation of the light receiving layer containing germanium atoms proceeds from the $t_B$ side toward the $t_T$ side.

Figure 2:
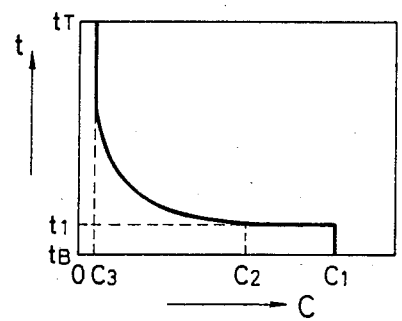
FIGS. 2 to 10 each shows a schematic illustration of the depth profile of germanium atoms in the light receiving layer.

In FIG. 2, there is shown a first typical embodiment of the depth profile of germanium atoms in the layer thickness direction in the light receiving layer.

In the embodiment as shown in FIG. 2, from the interface position $t_B$ at which the surface, on which the light receiving layer containing germanium atoms is to be formed, is in contact with the surface of said light receiving layer to the position $t_1$, germanium atoms exist in the formed light receiving layer, while keeping the content C of germanium atoms at a constant value of $C_1$, and the content gradually decreases from the content $C_2$ continuously from the position $t_1$ to the interface position $t_T$. At the interface position $t_T$, the content C of germanium atoms reaches $C_3$.

Figure 3:
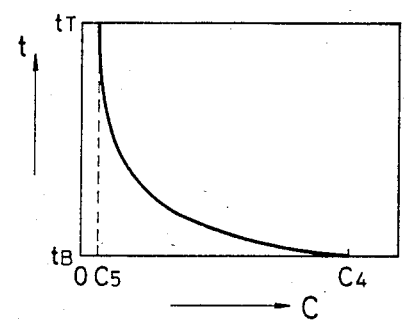

In an embodiment shown in FIG. 3, the content C of germanium atoms decreases gradually and continuously from the position $t_B$ to the position $t_T$ from the content $C_4$ until it reaches the content $C_5$ at the position $t_T$.

Figure 4:
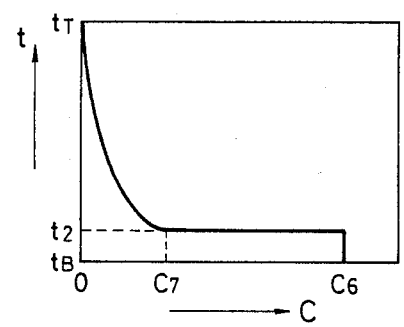

In case of FIG. 4, the content C of germanium atoms is kept at a constant $C_6$ from the position $t_B$ to the position $t_2$, gradually decreases continuously from the position $t_2$ to the position $t_T$, and the content C is substantially zero at the position $t_T$ (substantially zero herein means the content below the detectable limit).

Figure 5:
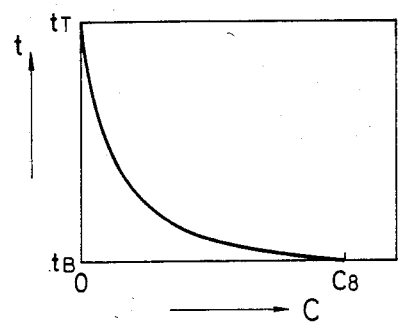

In case of FIG. 5, the content C of germanium atoms decreases gradually and continuously from the position $t_B$ to the position $t_T$ from the content $C_8$, until it reaches substantially zero at the position $t_T$.

Figure 6:
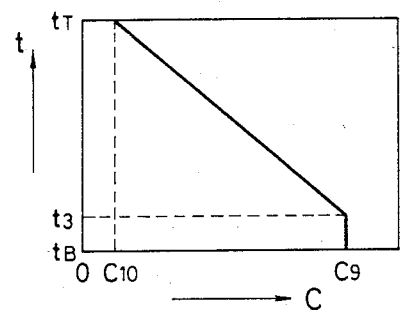

In an embodiment shown in FIG. 6, the content C of germanium atoms is kept at contant $C_9$ between the position $t_B$ and the position $t_3$, and it reaches $C_{10}$ at the position $t_T$. Between the position $t_3$ and the position $t_T$, the content decreases as a first order function from the position $t_3$ to the position $t_T$.

Figure 7:
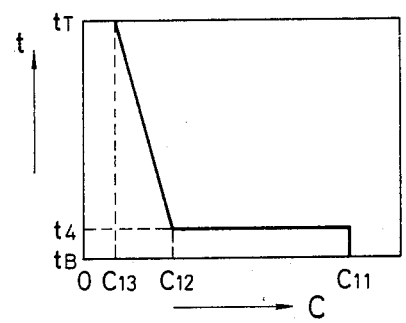

In an embodiment shown in FIG. 7, there is formed a depth profile such that the content C takes a constant $C_{11}$ from the position $t_B$ to the position $t_4$, and decreases as a first order function from the content $C_{12}$ to the content $C_{13}$ from the position $t_4$ to the position $t_T$.

Figure 8:
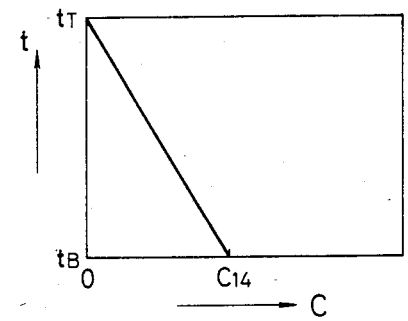

In an embodiment shown in FIG. 8, the content C of germanium atoms decreases as a first order function from the content $C_{14}$ to substantially zero from the position $t_B$ to the position $t_T$.

Figure 9:
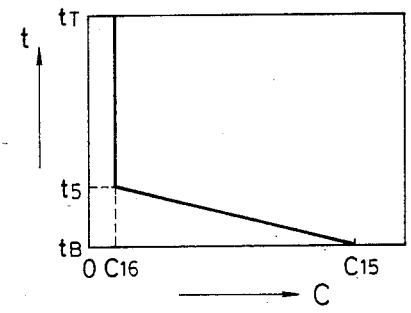

In FIG. 9, there is shown an embodiment, where the content C of germanium atoms decreases as a first order function from the content $C_{15}$ to $C_{16}$ from the position $t_B$ to $t_5$ and is kept at constant content $C_{16}$ between the position $t_5$ and $t_T$.

Figure 10:
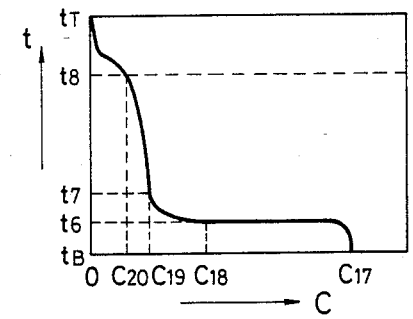

In an embodiment shown in FIG. 10, the content C of germanium atoms is kept at the content $C_{17}$ at the position $t_B$, whose content $C_{17}$ initially decreases gradually and abruptly near the position $t_6$, until it reaches the content $C_{18}$ at the position $t_6$.

Between the position $t_6$ and the position $t_7$, the content C initially decreases abruptly and thereafter gradually, until it reaches the content $C_{19}$ at the position $t_7$. Between the position $t_7$ and the position $t_8$, the content decreases very gradually to the content $C_{20}$ at the position $t_8$. Between the position $t_8$ and the position $t_T$, the content decreases along the curve having a shape as shown in the Figure from the content $C_{20}$ to substantially zero.

As described above about some typical examples of depth profiles of germanium atoms in the light receiving layer in the layer thickness direction by referring to FIGS. 2 through 10, in the preferred embodiment of the present invention, the photoconductive member shown in FIG. 1 has a depth profile so as to have a portion rich in content C of germanium atoms on the substrate side and a portion considerably poor in content C of germanium atoms on the interface $t_T$ side as compared with the substrate side.

The light receiving layer for the photoconductive member in the present invention desirably has a localized region (A) containing germanium atoms preferably in a relatively higher content on the substrate side or on the free surface side to the contrary as described above.

For example, the localized region (A), as explained in terms of the symbols shown in FIG. 2 through FIG. 10, may be desirably provided within the depth of 5μ from the interface position $t_B$.

Said localized region (A) may be made to be identical with the whole layer region ($L_T$) up to the depth of 5μ from the interface position $t_B$, or alternatively a part of the layer region ($L_T$). Whether the localized region (A) is made a part or whole of the layer region ($L_T$) depends on the characteristics required for the amorphous layer to be formed.

The localized region (A) may preferably be formed according to such a layer formation that the maximum value Cmax of the content of germanium atoms existing in the layer thickness direction may preferably be 1000 atomic ppm or more, more preferably 5000 atomic ppm or more, and most preferably $1 \times 10^4$ atomic ppm or more on basis of sum total with silicon atoms and silicon atoms.

That is, the light receiving layer containing germanium atoms is formed so that the maximum value Cmax of the content C may exist within a layer thickness of 5μ from the substrate side (the layer region within the depth of 5μ from $t_B$).

In the photoconductive member shown in FIG. 1, the content of germanium atoms in the light receiving layer may be selected as desired so as to effectively achieve the objects of the present invention, and is preferably 1 to $9.5 \times 10^5$ atomic ppm, more preferably 100 to $8 \times 10^5$ atomic ppm, and most preferably 500 to $7 \times 10^5$ atomic ppm, on the basis of sum total with silicon atoms.

In the photoconductive member shown in FIG. 1, the light receiving layer with desired characteristics can be formed as desired by designing the change rate curve of content C of germanium atoms so desired, when the germanium atoms are continuously distributed in the whole layer region and the content C of germanium atoms distributed in the layer thickness direction is made lower toward the free surface side of the light receiving layer or made higher torward the substrate side, or given an increasing change in the depth profile of germanium atoms in the light receiving layer.

For example, when the content curve of germanium atoms in depth profile is changed so that the content C of germanium atoms in the light receiving layer is made as high as possible on the substrate side and is made as much as possible on the free surface side of the light receiving layer, a higher photosensitization can be obtained in the whole region of wavelength ranging from the relatively short wavelength to the relatively long wavelength, including the visible light region, and also an interference of interferable light such as laser beam, etc. can be effectively prevented.

When a semi-conductor laser is used, the long-wavelength light cannot be thoroughly absorbed on the laser-irradiated surface side of the light receiving layer, but by increasing the content C of germanium atoms to an extreme at the end part on the substrate side of the light receiving layer, such long-wavelength light can be substantially completely absorbed in the layer region at the end part on the substrate side of the light receiving layer, and the interference by reflection from the substrate surface can be effectively prevented, as will be described later.

In the photoconductive member of the present invention, nitrogen atoms exist in the light receiving layer to attain a higher photosensitization and a higher dark resistance, and also to attain an improvement in adhesion between the substrate and the light receiving layer, and to prevent the charge injection from the free surface of the light receiving layer. In the light receiving layer, much more nitrogen atoms are made to exist particularly near the free surface of the light receiving layer, and, if necessary, near the substrate.

Figure 11:
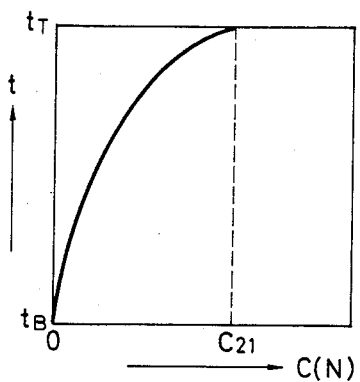
FIGS. 11 through 13 and 16 through 19 each shows a schematic illustration of the depth profile of nitrogen atoms in the light receiving layer.
Figure 12:
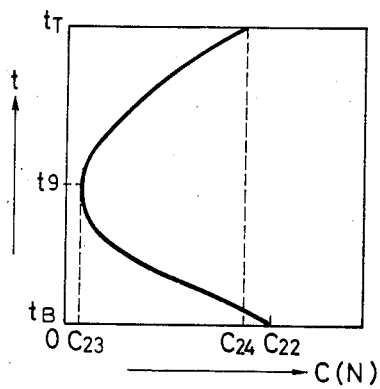
Figure 13:
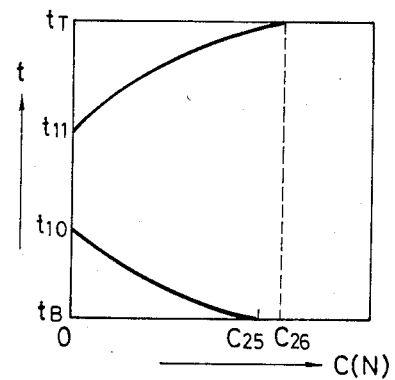

FIG. 11 through FIG. 13 each show a typical example of depth profile of nitrogen atoms throughout the light receiving layer, where symbols used for the illustration have the same meanings as used for FIG. 2 through FIG. 10, unless otherwise mentioned. In an embodiment shown in FIG. 11, the content C (N) of nitrogen atoms in depth profile continuously and monotonously increases from 0 to $C_{21}$ between the position $t_B$ and the position $t_T$.

In an embodiment shown in FIG. 12, the content C (N) of nitrogen atoms in depth profile is $C_{22}$ at the position $t_B$, and continuously and monotonously decreases from the content $C_{22}$ till the position $t_9$ at which the content C (N) reaches $C_{23}$. Between the position $t_9$ and the position $t_T$, the content C (N) of nitrogen atoms continuously and monotonously increases from the position $t_9$ until it reaches $C_{24}$ at the position $t_T$.

An embodiment of FIG. 13 is quite similar to the embodiment of FIG. 12, but differs therefrom only in that no nitrogen atoms are made to exist at the positions $t_{10}$ and $t_{11}$.

Between the position $t_B$ and the position $t_{10}$, the content C (N) continuously and monotonously decreases from $C_{25}$ at the position $t_B$ to 0 at the position $t_{10}$. Between the position $t_{11}$ and the position $t_T$, the content C (N) continuously and monotonously increases from 0 at the position $t_{11}$ to $C_{26}$ at the position $t_B$.

In the photoconductive member of the present invention, for example, a higher photosensitization and a higher dark resistance of the light receiving layer can be obtained at the same time by making more nitrogen atoms exist on the lower surface side and/or the upper surface side of the light receiving layer, making less nitrogen atoms exist inwards in the light receiving layer, while continuously changing the depth profile content C (N) of nitrogen atoms in the layer thickness direction, as shown in the typical examples of FIG. 11 through FIG. 13.

Furthermore, the interference due to the interferable light such as laser beam, etc. can be effectively prevented by continuously changing the depth profile of content C (N) of nitrogen atoms, and as a result the reflective index can be changed gently in the layer thickness direction owing to the inclusion of nitrogen atoms.

In the present invention, the content of nitrogen atoms existing in the layer region (N) in the light receiving layer can be selected as desired in view of the characteristics required for the layer region (N) itself, or when the layer region (N) is provided in direct contact with the substrate, the content can be selected as desired in view of organic relationships, such as relationship to characteristics at the contact interface with the substrate, etc.

Furthermore, when another layer region is provided in direct contact with the layer region (N), the content of nitrogen atoms can be selected as desired in view of relationships to characteristics of said another layer region or characteristics at the contact interface with said another layer region.

The amount of nitrogen atoms existing in the layer region (N) can be selected as desired in view of the characteristics required for the photoconductive member to be formed, and is preferably 0.001 to 50 atomic %, more preferably 0.002 to 40 atomic %, and most preferably 0.003 to 30 atomic %, on the basis of sum total of silicon atoms, germanium atoms, and nitrogen atoms [hereinafter referred to as "T(SiGeN)"].

In the present invention, when the layer region (N) occupies the whole region of the light receiving layer or when a ratio of the layer thickness To of layer region (N) to the layer thickness T of the light receiving layer is thoroughly large, though the layer region (N) does not occupy the entire region of the light receiving layer, the upper limit to the content of nitrogen atoms existing in the layer region (N) is desirably much less than said value.

In the present invention, when a ratio of the layer thickness To of layer region (N) to the layer thickness of the light receiving layer is at least 2/5, the upper limit to the content of nitrogen atoms existing in the layer region (N) is preferably 30 atomic % or less, more preferably 20 atomic % or less, and most preferably 10 atomic % or less, on the basis of T(SiGeN).

In the present invention, the layer region (N) containing nitrogen atoms as a constituent of the light receiving layer desirably has a localized region (B) containing the nitrogen atoms with a relative high content on the substrate side and/or the free surface side, as described above, where the adhesion between the substrate and the light receiving layer can be more improved and the receiving potential can be increased.

Said localized region (B) is desirably provided within the depth of 5μ from the substrate surface or from the free surface.

In the present invention, said localized region (B) can occupy the whole layer region ($L_T$) down to the depth of 5μ from the substrate surface or from the free surface, or can occupy a portion of the layer region ($L_T$).

Whether the localized region (B) occupies a portion or a whole portion of the layer region ($L_T$) depends on the characteristics required for the light receiving layer to be formed.

The localized region (B) is desirably formed so that the maximum value Cmax of the content C (N) of nitrogen atoms existing in depth profile in the layer thickness direction in the localized region (B) can be preferably 500 atomic ppm or more, more preferably 800 atomic ppm or more, and most preferably 1,000 ppm or more. That is, in the present invention, the layer region (N) containing the nitrogen atoms is desirably formed so that the maximum value Cmax of the content C (N) in depth profile can reside within the depth of 5μ from the substrate surface or from the free surface.

In the present invention, the halogen atoms (X), which can be contained, if necessary, in the light receiving layer, may include, for example, fluorine, chlorine, bromine, and iodine, among which fluorine and chlorine are particularly preferable.

In the photoconductive member of the present invention, the conductive characteristics of the light receiving layer can be controlled as desired by adding a substance (C) capable of controlling the conductive characteristics to the light receiving layer. Such substance (C) may include the so called impurities in the semi-conductor field. In the present invention, p-type impurities capable of imparting p-type conductive characteristics to a -SiGe(H,X) as a constituent for the light receiving layer, and n-type impurities capable of imparting n-type conductive characteristics thereto can be exemplified as the substance (C). More particularly, the p-type impurities may include atoms belonging to Group III of the periodic table (Group III atoms). such as B (boron), Al (aluminum), Ga (gallium), In (indium), Tl (thallium), etc., among which B and Ga are particularly preferably used.

The n-type inpurities may include atoms belonging to Group V of the periodic table (Group V atoms), such as P (phosphorus), As (arsenic), Sb (antimony), Bi (bismuth), etc., among which P and As are particularly preferably used.

In the present invention, the content of the substance (C) existing in the light receiving layer to control the conductive characteristics can be selected as desired in view of the conductive characteristics required for the light receiving layer, or in view of organic relationships such as relationship to characteristics at the contact interface with the substrate on which the light receiving layer is provided in direct contact therewith.

Furthermore, the content of the substance (C) existing in the light receiving layer to control the conductive characteristics can be selected as desired in view of relationships to the characteristics of other layer region to be provided in direct contact with said layer region or in view of relationships to the characteristics at the contact interface with said other layer region, when the substance (C) is made to locally exist in the desired layer region of the light receiving layer, particularly when the substance (C) is made to exist in the layer region at the end part on the substrate side of the light receiving layer.

In the present invention, it is desirable that the content of the substance (C) existing in the light receiving layer to control the conductive characteristics is preferably 0.01 to $5\times 10^4$ atomic ppm, more preferably 0.5 to $1\times 10^4$ atomic ppm, and most preferably 1 to $5\times 10^3$ atomic ppm.

In the present invention, when the content of the substance (C) existing in the layer region is preferably 30 atomic ppm or more, more preferably 50 atomic ppm or more, and most preferably 100 atomic ppm or more, it is desirable that said substance (C) exist locally in a layer region of the light receiving layer, particularly in the layer region (E) at the end part on the substrate side of the light receiving layer.

By the inclusion of the substance (C) capable of controlling the conductive characteristics in the layer region (E) at the end part on the substrate side of the light receiving layer in said content or more, the injection of electrons into the light receiving layer from the substrate side can be effectively prevented when the free surface of the light receiving layer is subjected to the charging treatment to $\oplus$ polarity in the case that the substance (C) is said p-type impurity. On the other hand, in the case that the substance (C) is said n-type impurity, injection of positive holes into the light receiving layer from the substrate side can be effectively prevented, when the free surface of the light receiving layer is subjected to the charging treatment to $\ominus$ polarity.

When a substance, capable of controlling the conductive characteristics in one polarity exists in the layer region (E) at the end part in this manner, the remaining layer region of the light receiving layer, that is, the layer region (Z), which is the part exclusive of the layer region (E) at the end part, can contain a substance capable of controlling the conductive characteristics in other polarity, or can contain a substance capable of controlling the conductive characteristics in the same polarity, in much less content than in the actual content of the layer region (E) at the end part.

In that case, the content of the substance existing in the layer region (Z) to control the conductive characteristics can be selected as desired in view of the polarity or the content of the substance existing in the layer region (E) at the end part, and is preferably 0.001 to 1000 atomic ppm, more preferably 0.05 to 500 atomic ppm, and most preferably 0.1 to 200 atomic ppm.

In the present invention, when a substance capable of controlling the conductive characteristics in same polarity exists in the layer region (E) at the end part and in the layer region (Z), it is desirable that the content of the substance in the layer region (Z) is preferably 30 atomic ppm or less.

In the present invention, a layer zone containing a substance capable of controlling the conductive characteristics in one polarity and a layer zone containing another substance capable of controlling the conductive characteristics in other polarity can be provided in direct contact with each other in the light receiving layer, so that the so called depletion layer can be provided at the contact region. That is, the so called p-n junction is formed by providing a layer region containing said p-type impurity and a layer region containing said n-type impurity in direct contact with each other in the light receiving layer so as to provide a depletion layer.

In the present invention, the light receiving layer, made of a-SiGe(H,X), may be formed according to the vacuum deposition method utilizing discharging phenomenon, such as glow discharge method, sputtering method or ion-plating method. For example, for forming the light receiving layer made of a-SiGe(H,X) according to the glow discharge method, the basic procedure comprises introducing a starting gas for Si supply capable of supplying silicon atoms (Si) and a starting gas for Ge supply capable of supplying germanium atoms (Ge), and, if necessary, a starting gas for introduction of hydrogen atoms (H) and/or a starting gas for introduction of halogen atoms (X) into a deposition chamber which can be internally brought to a reduced pressure, and exciting glow discharge in said deposition chamber, thereby forming a layer made of a-SiGe(H,X) on the surface of a substrate placed at a predetermined position. For non-uniformly distributing the germanium atoms, a layer made of a-SiGe(H,X) may be formed while controlling the depth profile of germanium atoms according to a desired change rate curve. Alternatively, in the formation according to the sputtering method, a target made of Si or two sheets of targets of said target and a target made of Ge, or a target of a mixture of Si and Ge is sputtered in an atmosphere of an inert gas such as Ar, He, etc. or a gas mixture based on these gases by introducing a starting gas for Ge supply, as diluted with a dilution gas such as He, Ar, etc., if desired, and a gas for introduction of hydrogen atoms (H) and/or a gas for introduction of halogen atoms (X), if desired, into a deposition chamber for sputtering, thereby forming a plasma atmosphere of a desired gas. To make non-uniform distribution of the germanium atoms, sputtering of said target is effected, while controlling the gas flow rates of the starting gas for supply of Ge according to a desired change rate curve.

In the case of the ion-plating method, for example, a vaporizing source such as polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) and vaporized, and the flying vaporized product is permitted to pass through a desired gas plasma atmosphere, otherwise following the same procedure as in the case of sputtering.

The starting gas for supplying Si to be used in the present invention may include gaseous or gasifiable silicon hydrides (silanes) such as $SiH_4$, $Si_2H_6$, $Si_3H_8$, $Si_4H_{10}$, etc. as effective materials. In particular, $SiH_4$ and $Si_2H_6$ are preferred with respect to easy handling during the layer formation and efficiency for supplying Si.

The substances which can effectively serve as starting gases for Ge supply may include gaseous or gasifiable germanium hydrides such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred with respect to easy handling during the layer formation and efficiency for supplying Ge.

Effective starting gases for introduction of halogen atoms to be used in the present invention may include a large number of halogen compounds, as exemplified preferably by gaseous or gasifiable halogen compounds such as halogen gases, halides, interhalogen compounds, halogen-substituted silane derivatives, and the like.

Further, gaseous or gasifiable silicon hydride compounds containing halogen atoms, that is, the compounds containing silicon atoms, and halogen atoms as constituent elements can be mentioned as effective ones in the present invention.

Typical examples of halogen compounds preferably used in the present invention may include halogen gases such as fluorine, chlorine, bromine or iodine, interhalogen compounds such as BrF, ClF, $ClF_3$, $BrF_5$, $BrF_3$, $IF_3$, $IF_7$, ICl, IBr, etc.

The silicon compounds containing halogen atoms, namely, so called silane derivatives substituted with halogen atoms, may be preferably exemplified by silicon halides such as $SiF_4$, $Si_2F_6$, $SiCl_4$, $SiBr_4$ and the like.

When the characteristic photoconductive member of the present invention is formed according to the glow discharge method by employment of such a silicon compound containing halogen atoms, it is possible to form the light receiving layer made of a-SiGe containing halogen atoms on a desired substrate without using a silicon hydride gas as the starting gas for Si supply together with the starting gas for Ge supply.

In the case of forming the light receiving layer containing halogen atoms according to the glow discharge method, the basic procedure comprises introducing, for example, a silicon halide as the starting gas for Si supply, germanium hydride as the starting gas for Ge supply and a gas such as Ar, $H_2$, He, etc. in a predetermined mixing ratio into a deposition chamber for forming the light receiving layer and exciting the glow discharge to form a plasma atmosphere of these gases, whereby the light receiving layer can be formed on a desired substrate. In order to control the ratio of hydrogen atoms to be introduced more easily, a hydrogen gas or a gas of a silicon compound containing hydrogen atoms may also be mixed with these gases in a desired amount and used to form the layer.

Also, each gas is not restricted to a single species, but a plurality of species may be available in any desired ratio.

In either case of the sputtering method and the ion-plating method, introduction of halogen atoms into the layer to be formed may be performed by introducing the gas of said halogen compound or said silicon compound containing halogen atoms into a deposition chamber and forming a plasma atmosphere of said gas.

To introduce hydrogen atoms, on the other hand, a starting gas for introduction of hydrogen atoms, for example, $H_2$ or gases such as silanes and/or germanium hydride as mentioned above, may be introduced into a deposition chamber for sputtering, followed by formation of the plasma atmosphere of said gases.

In the present invention, as the starting gas for introduction of halogen atoms, the halogen compounds or halogen-containing silicon compounds as mentioned above can effectively be used. In addition, it is also possible to use effectively as the starting material for formation of the light receiving layer gaseous or gasifiable substances, including halides containing hydrogen atoms as one of the constituents, e.g. hydrogen halide such as HF, HCl, HBr, HI, etc.; halogen-substituted silicon hydrides such as $SiH_2F_2$, $SiH_2I_2$, $SiH_2Cl_2$, $SiHCl_3$, $SiH_2Br_2$, $SiHBr_3$, etc.; germanium hydride-halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing hydrogen atoms can preferably be used as the starting material for introduction of halogen atoms, because hydrogen atoms, which are very effective for controlling electrical or photoelectric characteristics, can be introduced into the layer simultaneously with introduction of halogen atoms during formation of the light receiving layer.

To introduce hydrogen atoms structurally into the light receiving layer, $H_2$ or a silicon hydride such as $SiH_4$, $Si_2H_6$, $Si_3H_8$, $Si_4H_{10}$, etc. together with germanium or a germanium compound for supplying Ge, or germanium hydride such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. and together with silicon or a silicon compound for supplying Si can be introduced into a deposition chamber, followed by excitation of discharging, in addition to those as mentioned above.

According to a preferred embodiment of the present invention, the amount of hydrogen atoms (H) or the amount of halogen atoms (X) or the sum total of the amounts of hydrogen atoms and halogen atoms (H+X) existing in the light receiving layer 102 of the photoconductive member 100 is preferably 0.01 to 40 atomic %, more preferably 0.05 to 30 atomic %, and most preferably 0.1 to 25 atomic %.

To control the content of hydrogen atoms (H) and/or halogen atoms (X) existing in the light receiving layer, for example, the substrate temperature and/or the introduction rate into the deposition system of the starting materials for adding hydrogen atoms (H) or halogen atoms (X) to the layer, discharging power, etc. may be controlled.

The thickness of the light receiving layer in the photoconductive member of the present invention can be selected as desired so that the photocarrier generated in the light receiving layer can be efficiently transported, and is preferably 1 to 100μ, more preferably 1 to 80μ, and most preferably 2 to 50μ.

In the present invention, the layer region (N) containing nitrogen atoms can be provided in the light receiving layer by using the starting material for introducing the nitrogen atoms together with the starting material for forming said light receiving layer and adding the nitrogen atoms while controlling their content in the layer, while the light receiving layer is formed.

When the glow discharge method is used to form the layer region (N), the starting material for introducing nitrogen atoms is added to the starting material selected, as desired from those for forming the light receiving layer, as mentioned above. As the starting material for introducing nitrogen atoms, most of gaseous substances or gasified substances of gasifiable ones, which contain at least nitrogen atoms as the constituent atoms, can be used.

For example, a starting gas containing silicon atoms (Si) as the constituent atoms, a starting gas containing nitrogen atoms (N) as the constituent atoms and, if necessary, a starting gas containing hydrogen atoms (H) or halogen atoms (X) as the constituent atoms can be used by mixing in a desired mixing ratio, or a starting gas containing silicon atoms (Si) as constituent atoms and a starting gas containing nitrogen atoms (N) and hydrogen atoms (H) as the constituent atoms can be also used by mixing in a desired mixing ratio, or a starting gas containing silicon atoms (Si) as the constituent atoms and a starting gas containing silicon atoms (Si), nitrogen atoms (N) and hydrogen atoms (H) as three species of the constituent atoms can be also used by mixing.

Apart from this, a starting gas containing nitrogen atoms (N) as the constituent atoms can be used by mixing with a starting gas containing silicon atoms (Si) and hydrogen atoms (H) as the constituent atoms.

The starting material effectively used as the starting gas for introduction of nitrogen atoms (N) during formation of the layer region (N), it is possible to use compounds containing N as the constituent atoms or compounds containing N and H as the constituent atoms, such as gaseous or gasifiable nitrogen compounds, nitrides and azides, including for example, nitrogen ($N_2$), ammonia ($NH_3$), hydrazine ($H_2NNH_2$), hydrogen azide ($HN_3$), ammonium azide ($NH_4N_3$) and so on. Alternatively, with the advantage of introducing halogen atoms (X) in addition to nitrogen atoms (N), nitrogen halide compounds such as nitrogen trifluoride ($F_3N$), dinitrogen tetrafluoride ($F_4N_2$) and the like may be also used.

In the present invention, the layer region (N) can further contain oxygen atoms, besides the nitrogen atoms, to further promote the effect obtained by the nitrogen atoms.

The starting gas for introducing oxygen atoms into the layer region (N) includes, for example, oxygen ($O_2$), ozone ($O_3$), nitrogen monooxide (NO), nitrogen dioxide ($NO_2$), dinitrogen monooxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and lower siloxanes containing silicon atoms (Si), oxygen atoms (O) and hydrogen atoms (H) as constituent atoms such as disiloxane ($H_3SiOSiH_3$), trisiloxane ($H_3SiOSiH_2OSiH_3$), and the like.

To form the layer region (N) according to the sputtering method, Si wafer or $Si_3N_4$ wafer of single crystal or polycrystal, or a wafer containing Si and $Si_3N_4$ as a mixture is used as a target for sputtering in various gas atmospheres during formation of the light receiving layer.

For example, when a Si wafer is used as the target, a starting gas for introducing nitrogen atoms and, if necessary, hydrogen atoms and/or halogen atoms is introduced, as diluted with a dilution gas if necessary, into a deposition chamber for sputtering, and a gas plasma of these gases is formed to sputter said Si wafer.

Apart from this, the sputtering of separate targets of Si and $Si_3N_4$ or a single target of Si and $Si_3N_4$ as a mixture can be carried out in an atmosphere of a dilution gas or in a gas atmosphere containing at least hydrogen atoms (H) and/or halogen atoms (X) as the constituent atoms as a gas for sputtering. As the starting gas for introducing nitrogen atoms, a starting gas for introducing nitrogen atoms shown in said example of starting gases for the glow discharge method can be used effectively also for the sputtering.

In the present invention, when the layer region (N) containing nitrogen atoms is provided in the light receiving layer, the layer region (N) having a desired depth profile in the layer thickness direction is formed by changing the content C (N) of nitrogen atoms existing in the layer region (N) in the layer thickness direction.

According to the glow discharge method the content C (N) is changed by introducing into a deposition chamber a gas of the starting material for introducing nitrogen atoms, while appropriately changing the gas flow rate according to a desired change rate curve. This can be done, for example, by gradually changing the opening of a given needle valve provided in the gas line by the ordinary means, for example, manually or by an outside driving motor, or the like. In that case, the change rate for the flow rate is not necessarily linear, but the flow rate can be controlled according to a predetermined change rate curve by means of, for example, a microcomputer, etc. to obtain the desired content curve.

When the layer region (N) is formed according to the sputtering method by changing the content C (N) of nitrogen atoms in the layer thickness direction, thereby obtaining a desired depth profile of nitrogen atoms in the layer thickness direction, the desired depth profile can be obtained firstly by using a gaseous starting material for introducing nitrogen atoms as in the case of the glow discharging method, and appropriately changing the gas flow rate as desired during introduction of the gas into a deposition chamber.

Secondly, when a target for sputtering, for example, a target of Si and $Si_3N_4$ as a mixture, is used, the desired depth profile can be obtained by changing a mixing ratio of Si to $Si_3N_4$ in the layer thickness direction of the target in advance.

The substance (C) capable of controlling the conductive characteristics, for example, the group III atoms or the group V atoms, can be structurally introduced into the light receiving layer by introducing a gaseous starting material for introducing the group III atoms or a gaseous starting material for introducing the group V atoms into a deposition chamber together with other starting materials for forming the light receiving layer during formation of the layer. As the starting material for introduction of the group III atoms, it is desirable to use those which are gaseous at room temperature under atmospheric pressure or can readily be gasified at least under layer forming conditions. Typical examples of such starting materials for introduction of the group III atoms may include, particularly the compounds for introduction of boron atoms, boron hydrides, such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Furthermore, it is also possible to use $AlCl_3$, $GeCl_3$, $Ge(CH_3)_3$, $InCl_3$, $TlCl_3$ and the like.

The starting materials which can effectively be used in the present invention for introduction of the group V atoms may include, for introduction of phosphorus atoms, phosphorus hydride such as $PH_3$, $P_2H_4$, etc., phosphorus halides such as $PH_4I$, $PF_3$, $PF_5$, $PCl_3$, $PCl_5$, $PBr_3$, $PBr_5$, $PI_3$ and the like. Furthermore, it is also possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ and the like effectively as the starting material for introduction of the group V atoms.

The layer thickness of the layer region which constitutes the light receiving layer and contains a substance capable of controlling the conductive characteristics and which is provided particularly toward the substrate side in the present invention can be selected as desired in view of the characteristics required for said layer region and other layer region formed on said layer region also the constitute the light receiving layer. It is desired that its lower limit is preferably 30 Å or more, more preferably 40 Å or more, and most preferably 50 Å or more.

When the content of a substance existing in said layer region to control the conductive characteristics is 30 atomic ppm or more, it is desired that the upper limit to the thickness of said layer region is preferably 10μ or less, more preferably 8μ or less, and most preferably 5μ or less.

The substrate to be used in the present invention may be either electroconductive material or insulating material. The electroconductive material may be exemplified by metals such as NiCr, stainless steel, Al, Cr, Mo, Au, Nb, Ta, V, Ti, Pt, Pd etc. or alloys thereof.

The insulating material may be exemplified by usually used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one surface of these insulating substrates should preferably be subjected to electroconductive treatment, and it is desirable to provide other layers on the surface which has been subjected to said electroconductive treatment.

For example, the surface of a glass can be given an electroconductivity by providing a thin film of NiCr, Al, Cr, Mo, Au, Ir, Nb, Ta, V, Ti, Pt, Pd, $In_2O_3$, $SnO_2$, ITO ($In_2O_3+SnO_2$), etc. thereon. Alternatively, the surface of a synthetic resin film such as polyester film can be given an electroconductivity by vacuum vapor deposition, electron-beam deposition or sputtering of a thin film of metal such as NiCr, Al, Ag, Pd, Zn, Ni, Au, Cr, Mo, Ir, Nb, Ta, V, Ti, Pt, etc. or by laminating treatment with said metal. The substrate may be shaped in any form such as cylinders, belts, plates or others, and its form may be selected as desired. For example, when the photoconductive member 100 in FIG. 1 is to be used as an image forming member for electrophotography, it may desirably be formed into an endless belt or a cylinder for use in continuous high speed copying. The substrate may have a thickness, which can be selected as desired so that a photoconductive member as desired may be formed. When the photoconductive member is required to have a flexibility, the substrate is made as thin as possible, so far as the function of a substrate can be sufficiently exhibited. However, in such a case, the thickness is preferably 10μ or more from the viewpoints of fabrication and handling of the substrate as well as its mechanical strength.

Figure 14:
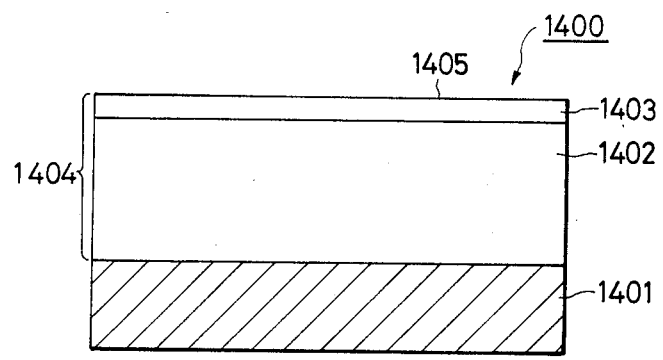

FIG. 14 shows a schematic illustration for explanation of the layer constitution of the photoconductive member according to the preferable second embodiment of the present invention.

The photoconductive member 1400 shown in FIG. 14 has a substrate 1401 for the photoconductive member, a first layer (I) 1402 provided on the substrate 1401, and a second layer (II) 1403 provided on the first layer (I) 1402, the second layer having a free surface 1405. The first layer (I) 1402 is made of a-SiGe(H,X), and contains nitrogen atoms and has a photoconductivity. A light receiving layer 1404 comprises the first layer (I) 1402 and the second layer (II) 1403.

The photoconductive member 1400 shown in FIG. 14 has a layer constitution similar to that of the photoconductive member 100 shown in FIG. 1, except that the second layer (II) 1403 is provided on the first layer (I) 1402. That is, the first layer (I) 1402 corresponds to the light receiving layer 102 shown in FIG. 1, and all the descriptions so far made in detail as to the light receiving layer 102 can be also applied to the first layer (I) 1402.

In the photoconductive member 1400 shown in FIG. 14, the second layer (II) 1403 formed on the first layer (I) 1402 has a free surface 1404, and is provided for accomplishing the objects of the present invention primarily in humidity resistance, continuous repeated use characteristic, dielectric strength, use environment characteristic and durability.

In the present invention, the second layer (II) 1403 is made of an amorphous material containing silicon atoms (Si) and at least one of carbon atoms (C) and oxygen atoms (O), and, if necessary, at least one of hydrogen atoms (H) and halogen atoms (X).

Thus, the respective amorphous materials constituting the first layer (I) and the second layer (II) have the common constituent of silicon atoms, and therefore chemical stability is sufficiently ensured at the interface between both layers (I) 1402 and (II) 1403.

The amorphous material constituting the second layer (II) may include an amorphous material containing silicon atoms (Si) and carbon atoms (C), and if necessary, hydrogen atoms (H) and/or halogen atoms (X) [hereinafter referred to as "a-$(Si_xC_{1-x})y(H,X)1-y$", wherein $0<x, y<1$], and an amorphous material containing silicon atoms (Si) and oxygen atoms (O), and, if necessary, hydrogen atoms (H) and/or halogen atoms (X) [hereinafter referred to as "a-$(Si_xO_{1-x})y(H,X)1-y$", wherein $0<x, y<1$].

The second amorphous layer (II) may be formed according to the glow discharge method, the sputtering method, the ion-implantation method, the ion-plating method, the electron beam method, etc. These preparation methods may be suitably selected in view of various factors such as the preparation conditions, the extent of the load for capital investment for installations, the production scale, the desirable characteristics required for the photoconductive member to be prepared, etc. With the advantages of relatively easy control of the preparation conditions for preparing photoconductive members having desired characteristics and easy introduction of silicon atoms, oxygen atoms, hydrogen atoms and halogen atoms, respectively, into the second layer (II) to be prepared, the glow discharge method or the sputtering method are preferably employed.

Further, in the present invention, the glow discharge method and the sputtering method may be used in combination in the same system to form the second layer (II).

For formation of the second layer (II) according to the glow discharge method, starting gases for formation of the second layer (II), which may, if necessary, be mixed with a dilution gas in a predetermined mixing ratio, may be introduced into a deposition chamber for vacuum deposition in which a substrate is placed, and glow discharge is excited in said deposition chamber to form gas plasma, thereby depositing the amorphous material for formation of the second layer (II) on the first layer (I) already formed on the substrate.

In the present invention, the starting gases for formation of the second layer (II) 103 may be exemplified by most of substances containing at least one of silicon atoms, carbon atoms, oxygen atoms, hydrogen atoms and halogen atoms as constituent atoms which are gaseous or gasified substances of readily gasifiable ones.

In the present invention, the starting gases which can be effectively used for formation of the second layer (II) 103 may include those which are gaseous under conditions of room temperature and atmospheric pressure or can be readily gasified.

In the present invention, the starting gases effectively used for formation of the second amorphous layer (II) may include silicon hydride gases containing silicon atoms and hydrogen atoms as constituent atoms such as silanes, for example, $SiH_4$, $Si_2H_6$, $Si_3H_8$, $Si_4H_{10}$, etc., compounds containing carbon atoms and hydrogen atoms as constituent atoms such as saturated hydrocarbons having 1 to 4 carbon atoms, ethylenic hydrocarbons having 2 to 4 carbon atoms and acetylenic hydrocarbons having 2 to 3 carbon atoms, single substances or compound containing oxygen atoms as constituent atoms, single substances of halogen, hydrogen halides, interhalogen compounds, silicon halide, halogen-substituted silicon hydride etc.

More specifically, they may include, as the saturated hydrocarbons, methane ($CH_4$), ethane ($C_2H_6$), propane ($C_3H_8$), n-butane (n-$C_4H_{10}$), pentane ($C_5H_{12}$); as the ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as the acetylenic hydrocarbons, acetylene ($C_2H_2$), methyl acetylene ($C_3H_4$), butyne ($C_4H_6$); as the single substances of halogen, fluorine, chlorine, bromine and iodine; as the hydrogen halides, HF, HI, HCl and HBr; as the interhalogen compounds, BrF, ClF, $ClF_3$, $ClF_5$, $BrF_5$, $BrF_3$, $IF_5$, $IF_7$, ICl, IBr; as the silicon halides, $SiF_4$, $Si_2F_6$, $SiCl_4$, $SiCl_3Br$, $SiCl_2Br_2$, $SiClBr_3$, $SiCl_3I$, $SiBr_4$; as the halogen-substituted silicon hydride, $SiH_2F_2$, $SiH_2Cl_2$, $SiHCl_3$, $SiH_3Cl$, $SiH_3Br$, $SiH_2Br_2$, $SiHBr_3$, etc.; and so on.

Besides, it is also possible to use halogen-substituted paraffinic hydrocarbons such as $CF_4$, $CCl_4$, $CBr_4$, $CHF_3$, $CH_2F_2$, $CH_3F$, $CH_3Cl$, $CH_3Br$, $CH_3I$, $C_2H_5Cl$, etc.; fluorinated sulfur compounds such as $SF_4$, $SF_6$, etc.; silane derivatives, including alkyl silanes such as $Si(CH_3)_4$, $Si(C_2H_5)_4$, etc. and halogen-containing alkyl silanes such as $SiCl(CH_3)_3$, $SiCl_2(CH_3)_2$, $SiCl_3CH_3$, etc. as effective ones.

The starting material effectively used as the starting gas for introduction of oxygen atoms (O) to be used during the formation of the second layer (II), it is possible to use compounds containing oxygen atoms as constituent atoms or compounds containing nitrogen atoms and oxygen atoms as constituent atoms, such as oxygen ($O_2$), ozone ($O_3$), nitrogen monooxide (NO), nitrogen dioxide ($NO_2$), dinitrogen monooxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and lower siloxanes containing silicon atoms, oxygen atoms and hydrogen atoms as constituent atoms such as disiloxane ($H_3SiOSiH_3$), trisiloxane ($H_3SiOSiH_2OSiH_3$), and the like.

These materials for formation of the second layer (II) may be selected and used as desired in formation of the second layer (II) so that silicon atoms, carbon atoms, oxygen atoms, hydrogen atoms and halogen atoms may exist in a predetermined composition ratio in the second layer (II).

For example, $Si(CH_3)_4$ as the material capable of easily adding silicon atoms, carbon atoms and hydrogen atoms and forming a layer having desired characteristics and $SiHCl_3$, $SiCl_4$, $SiH_2Cl_2$ or $SiH_3Cl$ as the material for adding halogen atoms may be mixed in a predetermined mixing ratio and introduced under a gaseous state into a device for formation of a second layer (II), followed by excitation of glow discharge, whereby a second layer (II) comprising s-$(Si_xC_{1-x})_y(Cl+H)_{1-y}$ can be formed.

For formation of the second layer (II) according to the sputtering method, any of single crystalline or polycrystalline Si wafer, graphite wafer, $SiO_2$ wafer and wafer containing silicon atom, carbon atom and/or oxygen atom as mixed therein is used as a target and subjected to sputtering in an atmosphere of various gases containing, if necessary, halogen atoms and/or hydrogen atoms as constituents. For example, when a silicon wafer is used as a target, starting gases for introducing carbon atoms and/or oxygen atoms, and hydrogen atoms and/or halogen atoms, which may be diluted with a dilution gas, if desired, are introduced into a deposition chamber for sputtering to form a gas plasma of these gases therein and effect sputtering of said silicon wafer.

Alternatively, silicon atoms and/or carbon atoms and/or oxygen atoms as separate targets or one target sheet of a mixture of silicon atoms, carbon atoms and/or oxygen atoms can be used and sputtering is effected in a gas atmosphere containing, if desired, hydrogen atoms and/or halogen atoms. As the starting gases for introduction of carbon atoms, oxygen atoms, hydrogen atoms and halogen atoms, substances for forming the second layer (II) as shown in the example of the glow discharge method as described above can be used as effective materials also for the sputtering.

In the present invention, the dilution gas to be used in formation of the second layer (II) by the glow discharge method or the sputtering method may include the so called rare gases such as He, Ne and Ar as preferable ones.

The second layer (II) in the present invention should be carefully formed so that the required characteristics may be given exactly as desired. That is, the substance containing silicon atoms, carbon atoms and/or oxygen atoms, and, if necessary, hydrogen atoms and/or halogen atoms as the constituent atoms can take structural forms ranging from crystalline to amorphous and show electrical properties ranging from conductive through semi-conductive to insulating and photoconductive properties ranging from photoconductive to non-photoconductive. Therefore, in the present invention, the preparation conditions are strictly selected as desired so as to form an amorphous material for constituting the second layer (II) having characteristics desired for the purpose. For example, when the second layer (II) is to be provided primarily for the purpose of improvement of dielectric strength, the amorphous material for constituting the second layer (II) is prepared as an amorphous material having marked electric insulating behaviours under the service environment.

Alternatively, when the primary purpose for the second layer (II) is an improvement of continuous repeated use characteristics or service environmental characteristics, the degree of the above electric insulating property may be alleviated to some extent and the aforesaid amorphous material may be prepared as an amorphous material having a sensitivity to some extent to the irradiation light.

In forming the second layer (II) on the surface of the first layer (I), the substrate temperature during the layer formation is an important factor having influences on the constitution and the characteristics of the layer to be formed, and it is desired in the present invention to strictly control the substrate temperature during the layer formation so as to obtain the second layer (II) having the desired characteristics.

For forming the second layer (II), an optimum temperature range is selected in conformity with the method for forming the second layer (II) to effectively attain the desired objects of the present invention. During the formation of the layer, the substrate temperature is preferably 20° to 400° C., more preferably 50° to 350° C., and most preferably 100° to 300° C. For the formation of the second layer (II), the glow discharge method or the sputtering method may be advantageously used, because fine control of the composition ratio of atoms existing in the layer or control of layer thickness can be conducted with relative ease as compared with other methods. In case that the second layer (II) is formed according to these layer forming methods, the discharging power during the formation of the layer is one of important factors influencing the characteristics of the second layer (II) similarly to the aforesaid substrate temperature.

The discharging power condition for the effective preparation with a good productivity of the second layer (II) having characteristics for accomplishing the objects of the present invention may preferably be 10 to 300 W, more preferably 20 to 250 W, and most preferably 50 to 200 W.

The gas pressure in a deposition chamber may preferably be 0.01 to 1 Torr, and more preferably 0.1 to 0.5 Torr.

In the present invention, the above numerical ranges can be mentioned as preferable ones for the substrate temperature, discharging power for the preparation of the second layer (II). However, these factors for the formation of the layer are not selected separately and independently of each other, but it is desirable that the optimum values of respective layer forming factors are selected on the basis of mutual organic relationships so that the second layer (II) having desired characteristics may be formed.

The contents of carbon atoms, and/or oxygen atoms existing in the second layer (II) are important factors for obtaining the desired characteristics to accomplish the objects of the present invention, similarly to the conditions for preparation of the second layer (II). The contents of carbon atoms and/or oxygen atoms existing in the second layer (II) in the present invention are selected as desired in view of the species of amorphous material constituting the second layer (II) and its characteristics.

More specifically, the amorphous material represented by the above formula a-$(Si_xC_{1-x})_y(H,X)_{1-y}$ may be roughly classified into an amorphous material constituted of silicon atoms and carbon atoms (hereinafter referred to as "a-$Si_aC_{1-a}$", where $0<a<1$), an amorphous material constituted of silicon atoms, carbon atoms and hydrogen atoms (hereinafter referred to as a-$(Si_bC_{1-b})_cH_{1-c}$, where $0<b, c<1$) and an amorphous material constituted of silicon atoms, carbon atoms, halogen atoms and, if necessary, hydrogen atoms (hereinafter referred to as "a-$(Si_dC_{1-d})_e(H,X)_{1-e}$", where $0<d, e<1$).

In the present invention, when the second layer (II) is made of a-$Si_aC_{1-a}$, the content of carbon atoms in the second layer (II) may be preferably $1 \times 10^{-3}$ to 90 atomic %, more preferably 1 to 80 atomic %, and most preferably 10 to 75 atomic %, namely in terms of representation by a in the above a-$Si_aC_{1-a}$, a being preferably 0.1 to 0.99999, more preferably 0.2 to 0.99, and most preferably 0.25 to 0.9.

In the present invention, when the second layer (II) is made of a-$(Si_bC_{1-b})_cH_{1-c}$, the content of carbon atoms in the second layer (II) may be preferably $1 \times 10^{-3}$ to 90 atomic %, more preferably 1 to 90 atomic %, and most preferably 10 to 80 atomic %, the content of hydrogen atoms preferably 1 to 40 atomic %, more preferably 2 to 35 atomic %, and most preferably 5 to 30 atomic %, and the photoconductive member formed when the hydrogen content is within these ranges can be sufficiently applicable as excellent one in the practical aspect.

That is, in terms of the representation by the above a-$(Si_bC_{1-b})_cH_{1-c}$, b is preferably 0.1 to 0.99999, more preferably 0.1 to 0.99, and most preferably 0.15 to 0.9, and c preferably 0.6 to 0.99, more preferably 0.65 to 0.98, and most preferably 0.7 to 0.95.

When the second layer (II) is made of a-$(Si_dC_{1-d})_e(H,X)_{1-e}$, the content of carbon atoms in the second layer (II) may be preferably $1 \times 10^{-3}$ to 90 atomic %, more preferably 1 to 90 atomic %, and most preferably 10 to 80 atomic %, the content of halogen atoms preferably 1 to 20 atomic %, more preferably 1 to 18 atomic %, and most preferably 2 to 15 atomic %. When the content of halogen atoms is within these ranges, the photoconductive member thus prepared is sufficiently applicable in the practical aspect. The content of hydrogen atoms contained if desired may be preferably 19 atomic % or less, and more preferably 13 atomic % or less.

That is, in terms of representation by d and e in the above a-$(Si_dC_{1-d})_e(H,X)_{1-e}$, d is preferably 0.1 to 0.99999, more preferably 0.1 to 0.99, and most preferably 0.15 to 0.9, and e preferably 0.8 to 0.99, more preferably 0.82–0.99, and most preferably 0.85 to 0.98.

On the other hand, the amorphous material represented by the above formula a-$(Si_xO_{1-x})_y(H,X)_{1-y}$ may be roughly classified into an amorphous material constituted of silicon atoms and oxygen atoms (hereinafter referred to as "a-$Si_aO_{1-a}$", where $0<a<1$), an amorphous material constituted of silicon atoms, oxygen atoms and hydrogen atoms (hereinafter referred to as a-$(Si_bO_{1-b})_cH_{1-c}$, where $0<b$, $c<1$) and an amorphous material constituted of silicon atoms, oxygen atoms, halogen atoms and, if desired, hydrogen atoms (hereinafter referred to as "a-$(Si_dO_{1-d})_e(H,X)_{1-e}$", where $0<d$, $e<1$).

In the present invention, when the second layer (II) is to be constituted of a-$Si_aO_{1-a}$, the content of oxygen atoms in the second layer (II) may be preferably 0.33 to 0.99999, more preferably 0.5 to 0.99, and most preferably 0.6 to 0.9, in terms of $a$ in the above formula a-$Si_aO_{1-a}$.

In the present invention, when the second layer (II) is made of a-$(Si_bO_{1-b})_cH_{1-c}$, the content of oxygen atoms in the second layer (II) may be preferably such that b in the above formula a-$(Si_bO_{1-b})_cH_{1-c}$ may be preferably 0.33 to 0.99999, more preferably be 0.5 to 0.9, and most preferably 0.6 to 0.9, and c preferably 0.6 to 0.99, more preferably 0.65 to 0.98, and most preferably 0.7 to 0.95.

When the second layer (II) is made of a-$(Si_dO_{1-d})_e(H,X)_{1-e}$, the content of oxygen atoms in the second layer (II) may be preferably such that d in the above formula a-$(Si_dO_{1-d})_e(H,X)_{1-e}$ may be preferably 0.33 to 0.99999, more preferably be 0.5 to 0.99, and most preferably 0.6 to 0.9, and e preferably 0.8 to 0.99, more preferably 0.82 to 0.99, and most preferably 0.85 to 0.98.

It is preferably 90 atomic % or less, more preferably 80 atomic % or less, and most preferably 70 atomic % or less on the basis of sum total of (H+X).

The range of the numerical value of layer thickness of the second layer (II) is one of the important factors for effectively accomplishing the objects of the present invention, and is selected as desired in view of the intended purpose so as to effectively accomplish the objects of the present invention.

The layer thickness of the second layer (II) must be also selected as desired with due considerations about the relationships with the contents of carbon atoms, and/or oxygen atoms, the relationship with the layer thickness of the first layer (I), as well as other organic relationships to the characteristics required for respective layer regions.

In addition, the layer thickness is desirably given considerations from economical view-point such as productivity or capability of mass production.

The second layer (II) in the present invention desirably has a layer thickness preferably of 0.003 to 30μ, more preferably 0.004 to 20μ, and most preferably 0.005 to 10μ.

The halogen atoms existing in the second layer (II) of the present invention are preferably fluorine, chlorine, bromine and iodine, among which fluorine and chlorine are desirable.

Figure 15:
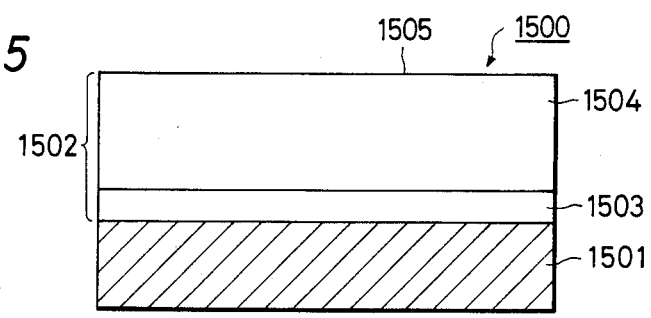

FIG. 15 is a schematic sectional view showing the layer constitution of a photoconductive member according a preferable third embodiment of the present invention.

The photoconductive member 1500 shown in FIG. 15 has a light receiving layer 1502 on a substrate 1501 for the photoconductive member, the light receiving layer 1502 having a free surface 1505 on its one end.

The light receiving layer 1502 has a layer structure comprising a first layer region (G) 1503 made of a-Ge(-Si,H,X) and a photoconductive second layer region (S) 1504 made of a-Si(H,X), the first layer region and the second layer region being laid on each other in this order from the substrate 1501 side.

The germanium atoms existing in the first layer region (G) 1503 may be uniformly distributed throughout the first layer region (G) 1503, or may be distributed without exception (i.e. throughout) in the layer thickness direction but not uniformly in the content of germanium atoms in depth profile. In any case, however, it is necessary that the germanium atoms are distributed uniformly and contained without exception in the interplanar direction, i.e. the direction in parallel to the substrate surface, to make the characteristics uniform in the interplanar direction. The germanium atoms are particularly so contained in the first layer region (G) 1503 that they should be contained without exception in the layer thickness direction of the light receiving layer 1502 and should be more distributed toward the substrate 1501 side than the side opposite to the substrate 1501—provide side (i.e. the free surface 1505 side of the light receiving layer 1502), or they should take quite a reversed depth profile.

In the photoconductive member shown in FIG. 15, it is desirable that the germanium atoms existing in said first layer region (G) 1503 can take said depth profile in the layer thickness direction and a uniform distribution state in the interplanar direction in parallel to the substrate surface.

In the photoconductive member shown in FIG. 15, no germanium atoms exist in the second layer region (S) 1504 provided on the first layer region (G) 1503. By making the light receiving layer having such a layer constitution, a photoconductor member having a distinguished photosensitivity to the whole region of wavelength ranging from the relatively short wavelength to the relatively long wavelength, including the visible light region can be obtained.

In a preferable embodiment, the depth profile of germanium atoms in the first layer region (G) 1503 is such that the germanium ions are continuously distributed without exception in the whole layer region and the content C of the germanium atoms is decreased toward the second layer region (S) 1503 from the substrate 1501 side, and thus a distinguished affinity can be obtained between the first layer region (G) 1503 and the second layer region (S) 1504. When a semi-conductor laser is used, the long-wavelength light is hardly absorbed in the second layer region (S) 1504, but such a light can be substantially completely absorbed in the first layer region (G) 1503. Thus, interference by the reflection on the substrate surface can be prevented.

When the silicon atoms exist in the first layer region (G) 1503 in the photoconductive member 1500 shown in FIG. 15, the amorphous materials for the first layer region (G) 1503 and the second layer region (S) 1504 have such a common constitution factor that the silicon atoms are common thereto. Thus, a chemical stability can be ensured at the interface therebetween.

Typical examples that the depth profile in the layer thickness direction of germanium ions existing in the first layer region (G) 1503 in the photoconductive member 1500 is non-uniform are shown in FIG. 2 through FIG. 10 for the illustration of the photoconductive member 100 shown in FIG. 1.

For the illustration of the photoconductive member 1500 shown in FIG. 15, the ordinate of FIG. 2 through FIG. 10 will show the thickness of the first layer region (G) 1503, $t_B$ the position of the end surface of the first layer region (G) 1503 on the substrate side, and $t_T$ the position of the end surface of the first layer region (G) 1503 on the opposite side to the substrate side.

In the photoconductive member 1500 shown in FIG. 15, the content of germanium atoms existing in the first layer region (G) 1503 can be selected as desired so as to effectively accomplish the objects of the present invention, and is preferably 1 to $1 \times 10^6$ atomic ppm, more preferably 100 to $9.5 \times 10^5$ atomic ppm, and most preferably 500 to $8 \times 10^5$ atomic ppm, on the basis of sum total with the silicon atoms existing in the first layer region (G) 1503.

The thickness each of the first layer region (G) 1503 and the second layer region (S) 1504 is one of important factors for effectively accomplishing the objects of the present invention, and must be carefully selected in designing the photoconductive member to thoroughly give the desired characteristics to the photoconductive member.

In the present invention, the thickness $T_B$ of the first layer region (G) 1503 is preferably 30 Å to 50μ, more preferably 40 Å to 40 μ, and most preferably 50 Å to 30μ. The thickness T of the second layer region (S) 1504 is preferably 0.5 to 90μ, more preferably 1 to 80μ, and most preferably 2 to 50μ.

Sum total of the thickness $T_B$ of the first layer region (G) 1503 and the thickness T of the second layer region (S) 1504, i.e. ($T_B+T$) is selected as desired in view of mutual organic relationship between the characteristics required for both layer regions and the characteristics required for the whole light receiving layer 1502.

In the photoconductive member shown in FIG. 15, the numerical range for ($T_B+T$) is preferably 1 to 100μ, more preferably 1 to 80μ, and most preferably 2 to 50μ.

In a more preferable embodiment of the present invention, the thickness $T_B$ and thickness T is selected as desired so as to satisfy a relationship of preferably $T_B/T \leq 1$, more preferably $T_B/T \leq 0.9$ and most preferably $T_B/T \leq 0.8$.

When the content of germanium atoms existing in the first layer region (G) is $1 \times 10^5$ atomic ppm or more, the thickness $T_B$ of the first layer region (G) 1503 is desirably as small as possible, and is preferably 30μ or less, more preferably 25μ or less, and most preferably 20μ or less.

The halogen atoms (X) existing in the first layer region (G) 1503 and/or the second layer region (S) 1504 for the light receiving layer 1502 may include, for example, fluorine, chlorine, bromine, and iodine, among which fluorine and chlorine are preferable.

In the photoconductive member 1500 shown in FIG. 15, a layer region (N) containing nitrogen atoms is provided in the light receiving layer 1502 to attain a higher photosensitization, and a higher dark resistance and to improve the adhesion between the substrate 1501 and the light receiving layer 1502, where the depth profile of nitrogen atoms existing in the light receiving layer and the manner to provide the layer region (N) are the same as those for the photoconductive member 100 shown in FIG. 1.

Typical examples of the depth profile of nitrogen atoms existing in the light receiving layer are also shown in FIG. 16 through FIG. 19 in addition to the examples shown in FIG. 11 through FIG. 13.

Even in FIG. 16 through FIG. 19, the abscissa shows the content C (N) of nitrogen atoms in the layer thickness direction, the ordinate the thickness of the light receiving layer, $t_B$ the position of the end surface (lower end surface) of the light receiving layer at the substrate side, and $t_T$ the position of the end surface (upper end surface) of the light receiving layer on the opposite side to the substrate side, similarly to those in FIG. 11 through FIG. 13. The light receiving layer undergoes layer formation from the $t_B$ side toward the $t_T$ side.

Figure 16:
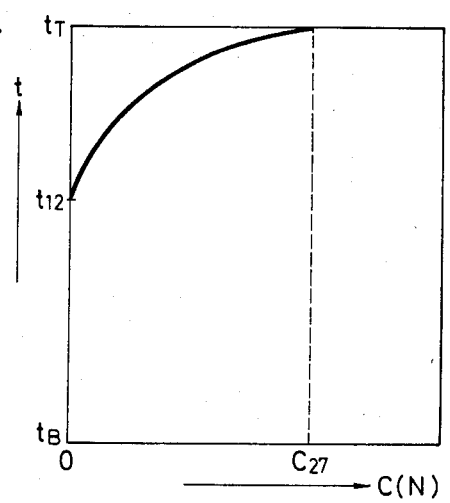

In an embodiment shown in FIG. 16, no nitrogen atoms are contained in the layer region from the position $t_B$ to the position $t_{12}$, and the content C (N) of nitrogen atoms gradually increases from the $t_{12}$ side toward the $t_T$ side in the layer region from the position $t_{12}$ to the free surface position $t_T$ of the light receiving layer until the content C (N) of nitrogen atoms reaches $C_{27}$ at $t_T$.

Figure 17:
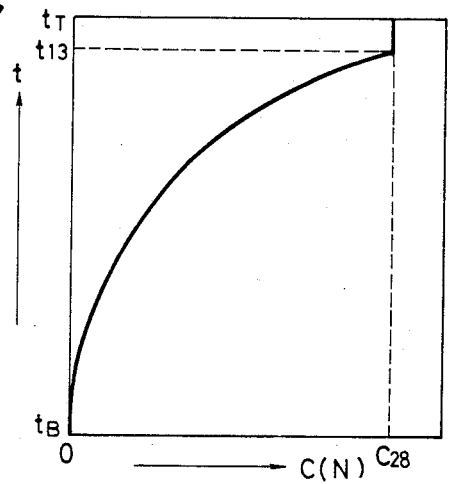

In an embodiment shown in FIG. 17, the content C (N) of nitrogen atoms monotonously increases from zero to $C_{28}$ in the layer region from the position $t_B$ to the position $t_{13}$, and is kept at constant $C_{28}$ in the layer region from the position $t_{13}$ to $t_T$.

Figure 18:
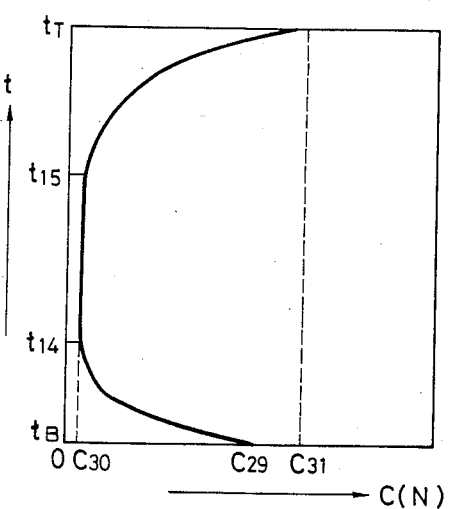

In an embodiment shown in FIG. 18, the content C (N) of nitrogen atoms gently increases from $C_{29}$ to $C_{30}$ in the region from the position $t_B$ to $t_{14}$, and is kept at constant $C_{30}$ in the layer region from the position $t_{14}$ to $t_{15}$. The content C (N) of nitrogen atoms continuously increases from $C_{30}$ to $C_{31}$ in the layer region from the position $t_{15}$ to $t_T$.

Figure 19:
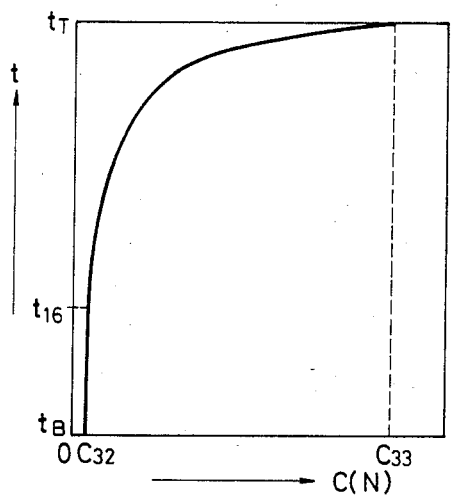

In an embodiment of FIG. 19, the content C (N) of nitrogen atoms is kept at constant $C_{32}$ in the layer region from the position $t_B$ to $t_{16}$ and gradually and slowly increases at the beginning and then rapidly increases in the layer region from the position $t_{16}$ to $t_T$ until it reaches $C_{33}$ at $t_T$.

In the photoconductive member 1500 shown in FIG. 15, the layer region (N) containing nitrogen atoms is provided in the light receiving region 1502, so as to occupy the whole layer region of the light receiving layer 1502 if a higher photosensitivity and a higher dark resistance are the main purpose, or so as to be provided near the free surface if the prevention of charge injection from the free surface of the light receiving layer 1502 is the main purpose or so as to occupy the layer region (E) at the end part on the substrate 1501 side of the light receiving layer 1502 if a stronger adhesion between the substrate 1501 and the light receiving layer 1502 is the main purpose.

In said first case, the content of nitrogen atoms existing in the layer region (N) is desirably made lower so as to maintain the high photosensitivity. In said second case, the content is desirably made higher near the surface so as to prevent charge injection from the free surface of the light receiving layer. In said third case, the content is desirably higher so as to ensure a stronger adhesion to the substrate.

To attain said three purposes at the same time, the depth profile of nitrogen atoms is so formed in the layer region (N) that the nitrogen atoms are distributed in a relatively high content toward the substrate side, in a relatively low content at the center of the light receiving layer and in a higher content in the surface layer region at the free surface side of the light receiving layer 1502.

Quite same explanation as made as to the layer region (N) in the photoconductive member 100 shown in FIG. 1 can be applied to other than those already made as to the layer region (N) in the photoconductive member 1500 shown in FIG. 15.

In the present invention, the first layer region (G) made of a-Ge(Si,H,X) can be formed according to a vacuum deposition method utilizing an electric discharge phenomenon as that for a-SiGe(H,X). For example, the first layer region (G) made of a-Ge(Si,H,X) can be formed according to a glow discharge method basically by introducing a starting gas for Ge supply capable of supplying germanium ions (Ge), and if necessary, a starting gas for Si supply capable of supplying silicon atoms (Si), a starting gas for introducing hydrogen atoms (H) and/or a starting gas for introducing halogen atoms (X) into a deposition chamber, whose inside can be made subatmospheric, under a desired gas pressure, and exciting glow discharge in the deposition chamber, thereby forming a layer made of a-Ge(Si,H,X) on a predetermined substrate surface placed at the predetermined position.

To contain the germanium atoms in a non-uniform depth profile, a layer made of a-Ge(Si,H,X) is formed while controlling the content of germanium atoms according to a change rate curve.

The layer can be also formed according to the sputtering method, for example, by using a target made of Si, or two targets, i.e. said target and a target made of Ge, or a target made of Si and Ge as a mixture in an inert gas of Ar, He, etc. or in an atmosphere of a gas mixture based on said gases, and if necessary, introducing a starting gas for Ge supply, diluted with a dilution gas such as He, Ar, etc., or if necessary, a gas for introducing hydrogen atoms (H) and/or halogen atoms (X) into a deposition chamber for sputtering, followed by generating a plasma atmosphere of desired gas. To make non-uniform distribution of germanium atoms, for example, the target is sputtered while controlling the gas flow rate of the starting gas for Ge supply according to a desired change rate curve.

All the starting gases already described as to the formation of the layer made of a-SiGe(H,X) can be used as the starting gas for forming the first layer region (G).

In the photoconductive member 1500 shown in FIG. 15, the second layer region (S) 1504 made of a-Si(H,X) can be formed according to the same procedure and conditions as used for forming the first layer region (G) 1503 by using the starting materials excluding the starting material that can serve as the starting gas for Ge supply from the starting materials (I) for forming said first layer region (S) [starting materials (II) for forming the second layer region (S) 1504].

That is, in the present invention, the second layer region (S) made of a-Si(H,X) can be formed according to a vacuum deposition method utilizing an electric discharge phenomenon, for example, a glow discharge method, a sputtering method, an ion-plating method, etc. For example, the second layer region (S) 1504 made of a-Si(H,X) can be formed according to a glow discharge method basically by introducing said starting gas for Si supply capable of supplying silicon atoms (Si), if necessary, together with a starting gas for introducing hydrogen atoms and/or a starting gas for introducing halogen atoms (X) into a deposition chamber, whose inside can be made subatmospheric, and exciting glow discharge in the deposition chamber, thereby forming a layer made of a-Si(H,X) on the predetermined substrate surface placed at the predetermined position.

The layer can be also formed according to a sputtering method, for example, by introducing a gas for introducing hydrogen atoms (H) and/or halogen atoms (X) into a deposition chamber for sputtering, when a target made of Si is sputtered in an inert gas of Ar, He, etc, or in an atmosphere of a gas mixture based on said gases.

The content of hydrogen atoms (H), or halogen atoms (X) or sum total of hydrogen atoms and halogen atoms (H+X) existing in the second layer region (S) is preferably 1 to 40 atomic %, more preferably 5 to 30 atomic %, and most preferably 5 to 25 atomic %.

Descriptions made as to the photoconductive member 100 shown in FIG. 1 can be also applied to the corresponding parts of the photoconductive member 1500 shown in FIG. 15. Thus, those so far omitted from the descriptions of the photoconductive member 1500 should be referred to the descriptions of the photoconductive member 100 shown in FIG. 1.

Figure 20:
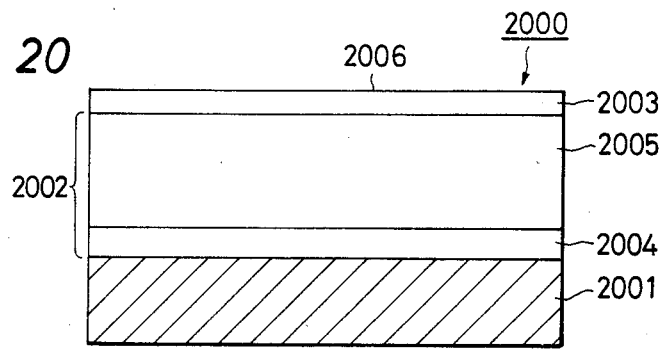

FIG. 20 is a schematic cross-sectional view showing the layer constitution of a photoconductive member according to a preferable fourth embodiment of the present invention.

The photoconductive member 2000 shown in FIG. 20 has a substrate 2001 for the photoconductive member, a first layer (I) 2002 provided on the substrate 2001, and a second layer (II) 2003 provided on the first layer (I) 2002, and has the same constitution as that of the photoconductive member 1500 shown in FIG. 15 except for the second layer (II) 2003 in the photoconductive member 2000. That is, the first layer (I) 2002 corresponds to the light receiving layer 1502; the first layer region (G) 2004 to the first layer region (G) 1503; and the second layer region (G) 2005 to the second layer region (S) 1504, and all the descriptions so far made as to the light receiving layer 1502 in FIG. 15 are also applicable to the first layer (I) 2002. The second layer (II) 2003 is the same layer as the second layer (II) of the photoconductive member 1400 shown in FIG. 14, and all the descriptions so far made as to the second layer (II) 1403 can be also applied to the second layer (II) 2003.

The photoconductive member of the present invention so designed as to have the layer structure so far described in detail can solve all of the afore-mentioned problems, and shows very distinguished electrical, optical and photoconductive characteristics and also distinguished dielectric strength and service environmental characteristics.

Particularly when applied to an image-forming member for the electrophotography, the present photoconductive member has no influence of residual potential on the image formation, stable electric characteristics, a higher sensitivity, a high SN ratio, a high light fatigue resistance, longer repeated use characteristics, a clear halftone, and a high resolution, and can produce high quality images stably and repeatedly.

Furthermore, the present photoconductive member can be used continuously and repeatedly at a high speed for a long time, since the light receiving layer itself formed on the substrate is tough and considerably distinguished in the adhesion to the substrate.

Still furthermore, the present photoconductive member has a high photosensitivity in the whole visible light region, a good matching particularly to semi-conductor laser and a high response to light.

Next, an example of the process for producing the photoconductive member of this invention is to be briefly described.

Figure 21:
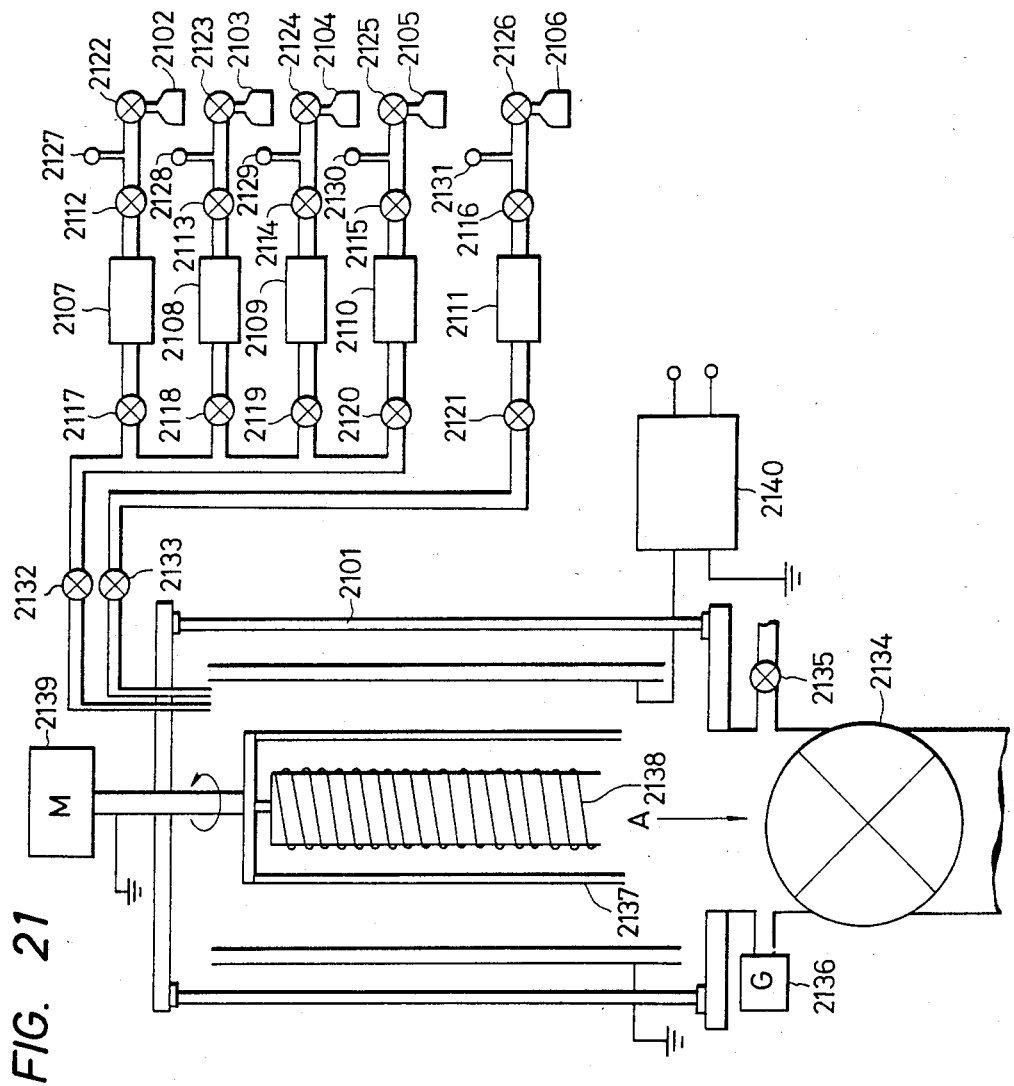
FIG. 21 is a schematic view of an apparatus used in the present invention.

FIG. 21 shows one example of an apparatus for producing a photoconductive member.

Gas cylinders 2102 to 2106 hermetically contain starting gases for formation of the photosensitive member of the present invention. For example, 2102 contains $SiH_4$ gas diluted with He (purity: 99.999%, hereinafter referred to as $SiH_4$/He), cylinder 2103 contains $GeH_4$ gas diluted with He (purity: 99.999%, hereinafter referred to as $GeH_4$/He), cylinder 2104 contains $SiF_4$ gas diluted with He (purity: 99.999%, hereinafter referred to as $SiF_4$/He), cylinder 2105 contains $NH_3$ gas (purity: 99.999%), and cylinder 2106 contains $H_2$ gas (purity: 99.999%).

These gases are led into a reaction chamber 2101, after confirmation of valves 2122–2126 to the gas cylinders 2102–2106 and leak valve 2135 as closed, and inflow valves 2112–2116, outflow valves 2117–2121 and auxiliary valves 2132 and 2133 as opened, by opening main valve 2134 at first to evacuate the reaction chamber 2101 and gas pipelines, and, when vacuum indicator 2136 indicates $5 \times 10^{-6}$ Torr, by opening the auxiliary valves 2132 and 2133 and the outflow valves 2117–2121.

Now, an example of forming a light receiving layer on a cylindrical substrate 2137 will be described. $SiH_4$/He gas from the gas cylinder 2102, $GeH_4$/He gas from the gas cylinder 2103, $NH_3$ gas from the gas cylinder 2105 are led into mass-flow controllers 2107, 2108, and 2109, respectively, by opening the valves 2122, 2123 and 2124 and controlling the pressures at outlet pressure gauges 2127, 2128 and 2129 to 1 Kg/cm$^2$ respectively and gradually opening the inflow valves 2112, 2113 and 2114, respectively. Successively, the outflow valves 2117, 2118 and 2119 and the auxiliary valve 2132 are gradually opened to lead respective gases into the reaction chamber 2101. The outflow valves 2117, 2118 and 2119 are so controlled that the flow rate ratio of the $SiH_4$/He gas, the $GeH_4$/He gas and the $NH_3$ gas may have a desired value and opening of the main valve 2134 is also adjusted while watching the vacuum indicator 2136 so that the pressure in the reaction chamber 2101 may reach a desired value. After confirming that the temperature of the substrate 2137 is set at about 50°- about 400° C. by heater 2138, power source 2140 is set at a desired power to excite glow discharge in the reaction chamber 2101, and at the same time the flow rates of the $NH_3$ gas and the $GeH_4$/He gas are controlled according to a predetermined change rate curve by gradually changing the opening of the valve 2118 manually or by an outside driving motor, or by other means, thereby controlling the contents of nitrogen atoms and germanium atoms existing in the layer thus formed. In this manner, the first layer (I) shown in FIG. 15 is formed on the substrate.

A second layer (II) can be formed on the first layer (I) thus formed to the desired thickness by similar valve operations as used for forming the first layer (I), for example, by leading a $SiH_4$ gas, a $C_2H_4$ gas and/or a NO gas, after diluted with a dilution gas such as He, etc. if necessary, into the reaction chamber 2101 and exciting glow discharge under the desired conditions.

To contain halogen atoms in the second layer (II), the second layer (II) is formed in the same manner as above by adding a $SiF_4$ gas, a $C_2H_2$ gas and/or a $NO_2$ gas or together with the $SiF_4$ gas thereto.

It is needless to say that all the outflow valves excluding those for the necessary gases for producing the respective layers are closed. Also, in order to avoid remaining of the gas used for the formation of the preceding layer in the reaction chamber 2101 and the gas pipelines from the outflow valves 2117–2121 to the reaction chamber 2101 during the formation of the respective layers, the system can be evacuated to vacuum, if necessary, by closing the outflow valves 2117–2121, opening the auxiliary valves 2132 and 2133, and fully opening the main valve 2134.

Each content of carbon atoms, and/or oxygen atoms existing in the second layer (II) can be controlled as desired, for example, in the case of glow discharge, by changing the flow rate ratio of the $SiH_4$ gas and the $C_2H_4$ gas and/or the NO gas to be introduced into the reaction chamber 2101 as desired, or in the case of layer formation by sputtering, by changing the sputtering area ratio of silicon wafer to graphite wafer, and/or $SiO_2$ wafer or molding a target from a mixture of silicon powder with among graphite powder in various mixing ratios. The content of halogen atoms (X) existing in the second layer (II) can be controlled by controlling the flow rate of the starting gas for introduction of halogen atoms such as the $SiF_4$ gas when introduced into the reaction chamber 2101.

Also, for uniformization of the layer formation, it is desirable to rotate the substrate 2137 by means of a motor 2139 at a constant speed during the layer formation.

The present invention is described in more detail by referring to the following Examples.

EXAMPLE 1

By means of the apparatus shown in FIG. 21, respective samples of image forming member for electrophotography (see Table 2A) (Samples Nos. 11-1A to 13-3A) on cylindrical aluminum substrates under the conditions shown in Table 1A.

Figure 22:
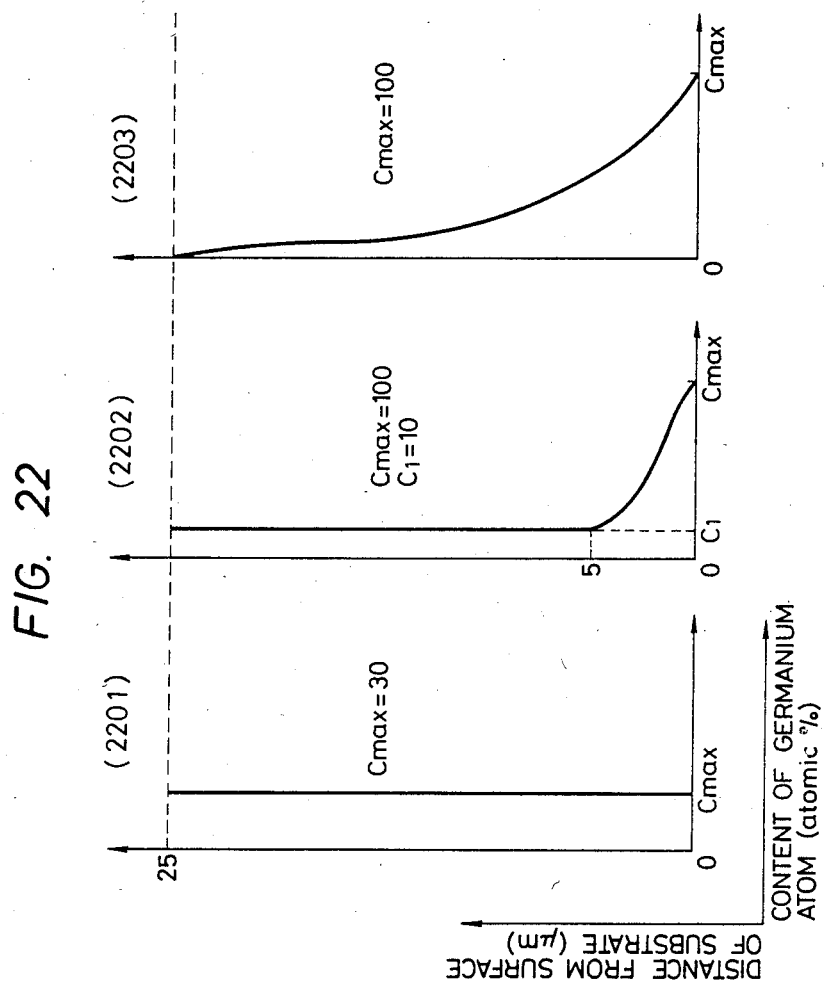
FIGS. 22 through 24 each shows a schematic illustration of the depth profile of the respective atoms in Examples of the present invention.
Figure 23:
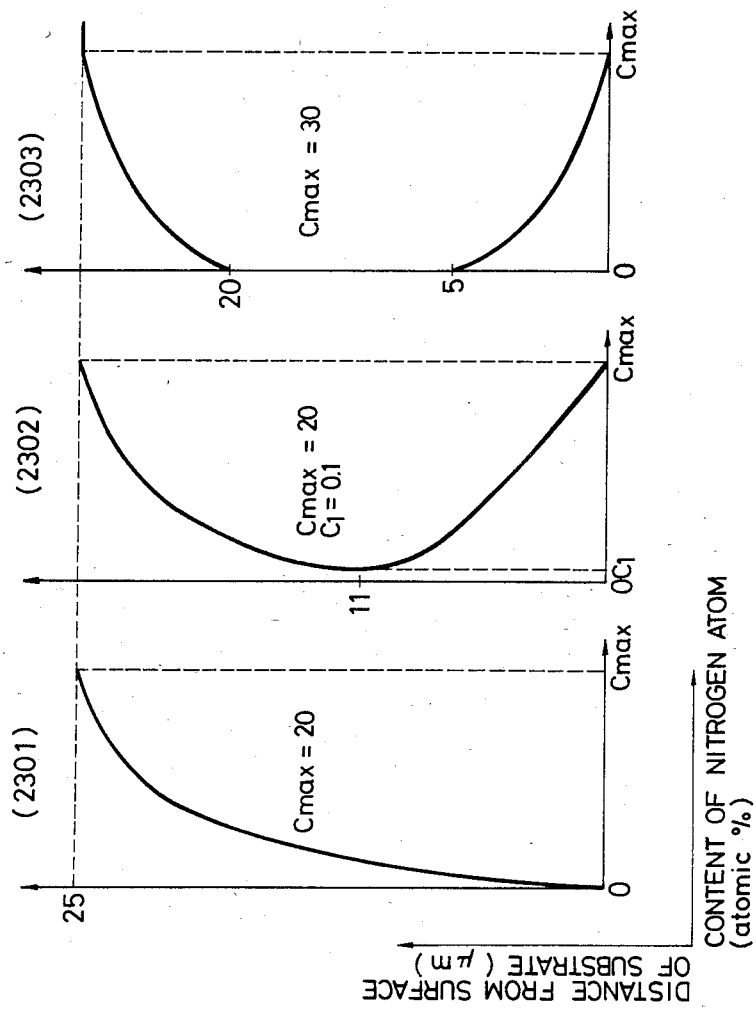
Figure 24:
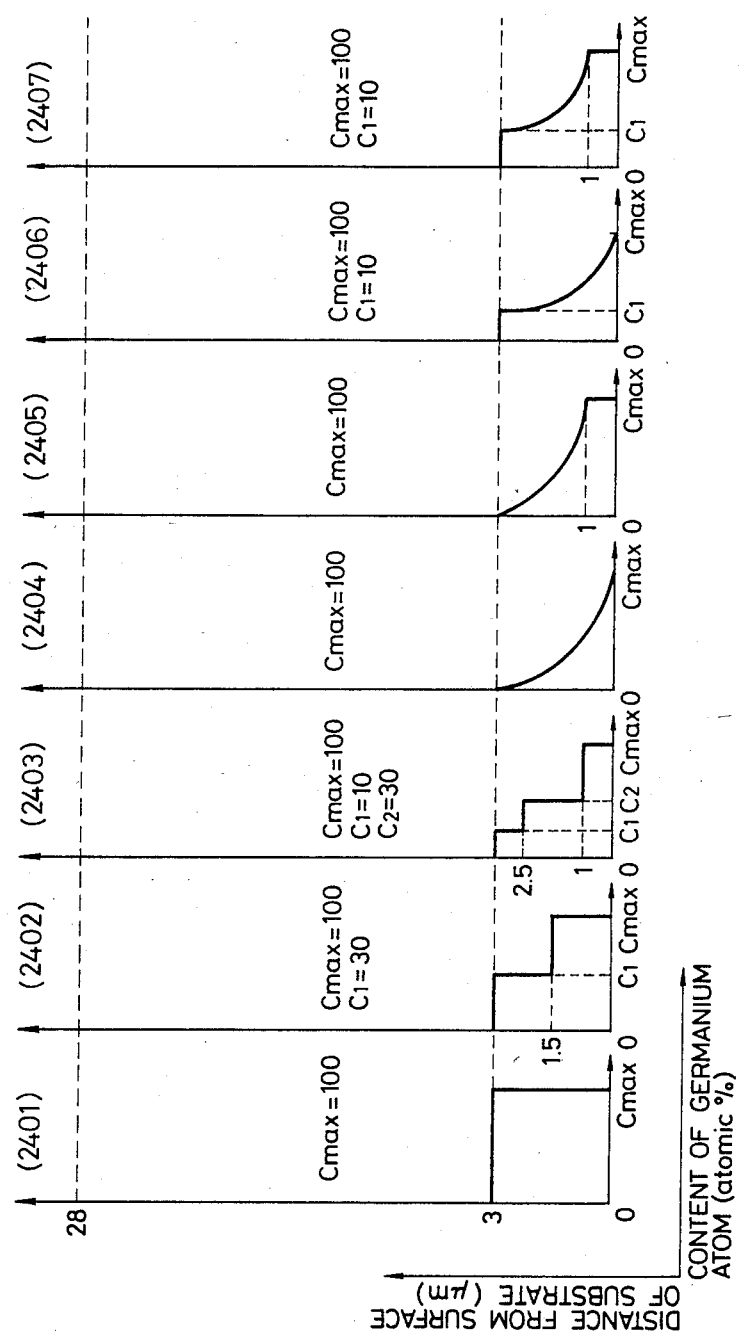

Content of germanium atoms and content of nitrogen atoms in the respective samples are shown in FIG. 22 and FIG. 23, respectively.

Each of the samples thus obtained was set in a charging-exposure testing device and subjected to corona charging at ⊕ 5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing a toner and a carrier) was cascaded on the surface of the light receiving layer to give a good toner image on the surface of the light receiving layer. When the toner image on the light receiving layer was transferred onto a transfer paper by corona charging of ⊕ 5.0 KV, a clear image of high density with an excellent resolution and a good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation of toner transferred image was performed for each sample. As the result, an image of high quality, excellent in resolution and good in gradation reproducibility, could be obtained in every sample.

EXAMPLE 2

By means of the apparatus shown in FIG. 21, respective samples of image forming member for electrophotography (see Table 4A) (Samples Nos. 21-1A to 23-3A) were prepared on cylindrical aluminum substrates under the conditions shown in Table 3A.

Content of germanium atoms and content of nitrogen atoms in the respective samples are shown in FIG. 22 and FIG. 23.

For each of these samples, the same image evaluation test was conducted as in Example 1 and a toner transferred image of high quality was obtained in each sample. Also, for each sample, use test with 200,000 repetitions was performed under the environment of 38° C. and 80% RH. As the result, no lowering in image quality was observed in each sample.

EXAMPLE 3

By means of the apparatus shown in FIG. 21, respective samples of image forming members for electrophotography (see Table 2B)(Samples Nos. 11-1B to 13-3B) were prepared, respectively, on cylindrical aluminum substrates under the conditions shown in Table 1B.

Content of germanium atoms and content of nitrogen atoms in the respective samples are shown in FIG. 22 and FIG. 23, respectively.

Each of the samples thus obtained was set in a charging-exposure testing device and subjected to corona charging at $\oplus$ 5.0 KV for 0.3 sec., followed immediately by irradiation of a light image. The image was irradiated by means of a tungsten lamp light source at a dose of 2 lux.sec through a transmission type test chart.

Immediately thereafter, $\ominus$ chargeable developer (containing a toner and a carrier) was cascaded on the surface of the light receiving layer to give a good toner image on the surface of the sample light receiving layer. When the toner image on the sample was transferred onto a transfer paper by corona charging of $\oplus$ 5.0 KV, a clear image of high density with an excellent resolution and a good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation of the toner transferred image was performed for each sample. As the result, an image of high quality, excellent in resolution and good in gradation reproducibility, could be obtained in every sample.

EXAMPLE 4

By means of the apparatus shwon in FIG. 21, respective samples of image forming members for electrophotography (see Table 4B)(Samples Nos. 21-1B to 23-6B) were prepared on cylindrical aluminum substrates under the conditions shown in Table 3B, where the first layer region in the layer (I) was formed on the Al substrate and the second layer region was formed on the first layer region.

The content of germanium atoms and the content of nitrogen atoms in the respective samples are shown in FIG. 22 and FIG. 23.

For each of these samples, the same image evaluation test was conducted as in Example 3 and a toner transferred iamge of high quality was obtained in each sample. Also, for each sample, use test with 200,000 repetitions was performed under the environment of 38° C. and 80% RH. As the result, no lowering in image quality was observed in each sample.

EXAMPLE 5

24 samples of image forming member for electrophotography (Samples Nos. 11-1-1B to 11-1-8B, 12-1-1B to 12-1-8B and 13-1-1B to 13-1-8B) were prepared in the same manner and conditions as those for Samples Nos. 11-1B, 12-B and 13-1B of Example 3, except that the conditions for forming the layer (II) shown in Table 5B were used.

The thus prepared samples of image forming member for electrophotography were separated mounted on a copying apparatus and the overall image evaluation and durability evaluation by continuously repeated use of transferred image were conducted for the respective samples of image forming member for electrophotography corresponding to the respective Examples under the same conditions as disclosed in the respective Examples.

Results of the overall image evaluation of transferred images and durability evaluation by continuously repeated use of the respective samples are shown in Table 6.

EXAMPLE 6

Samples of image forming members were prepared in the same manner as that for Sample No. 11-1B of Example 3 except that the target area ratio of silicon wafer:-graphite wafer was changed during the formation of the layer (II) to change a content ratio of silicon atoms to carbon atoms in the layer (II). After about 50,000 repetitions of the steps of image forming, developing and cleaning as descibed in Example 3 for the thus obtained samples of image forming member, the image evaluation was conducted. The results are shown in Table 7B.

EXAMPLE 7

Samples of image forming member were prepared in the same manner as that for Sample No. 12-1B of Example 3 except that a flow rate ratio of a SiH$_4$ gas:a C$_2$H$_4$ gas was changed during the formation of the Layer (II) to change a content ratio of silicon atoms to carbon atoms in the layer (II). After about 50,000 repetition of the steps as described in Example 3 for the respective thus obtained samples of image forming members, the image evaluation was conducted. Results are shown in Table 8.

EXAMPLE 8

Samples of image forming member were prepared in the same manner as that for Sample No. 13-1B of Example 3 except that a flow rate ratio of a SiH$_4$:a SiF$_4$ gas:a C$_2$H$_4$ gas was changed during the formation of the Layer (II) to change a content ratio of silicon atoms to carbon atoms in the layer (II). After about 50,000 repetitions of the steps of image forming, developing and cleaning for the thus obtained, respective samples of image forming members, the image evaluation was conducted. Results are shown in Table 9B.

EXAMPLE 9

Sample of image forming member were prepared in the same manner as that for Sample No. 11-1B of Example 3 except that the layer thickness of layer (II) was changed, and subjected to repetitions of the steps of image forming, developing and cleaning, as described in Example 3, and the evaluation was conducted. Results are shown in Table 10B.

EXAMPLE 10

By means of the apparatus shown in FIG. 21, respective samples of image forming members for electrophotography (Samples No. 1-1C to No. 13-3C; see Table 2C were prepared on cylindrical aluminum substrates under the conditions shown in Table 1.

The content of germanium atoms and the content of nitrogen atoms in the respective samples are shown in FIG. 22 and FIG. 23, respectively.

Each of the samples thus obtained was set in a charging-exposure testing device and subjected to corona charging at ⊕ 5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing a toner and a carrier) was cascaded on the surface of the light receiving layer to give a good toner image on the surface of the sample (light receiving layer). When the toner image on the sample (light receiving layer) was transferred onto a transfer paper by corona charging of ⊕ 5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 11

By means of the apparatus shown in FIG. 21, respective samples of image forming member for electrophotography (Samples Nos. 21-1C to 23-5C: see Table 4C) were prepared on cylindrical aluminum substrates under the conditions shown in Table 3C.

The content of germanium atoms and the content of nitrogen atoms in the respective samples are shown in FIG. 22 and FIG. 23, respectively.

For each of these samples, the same image evaluation test was conducted as in Example 10 and a toner transferred image of high quality was obtained in each sample. Also, for each sample, use test with 200,000 repetition was performed under the environmnet of 38° C. and 80% RH. As the result, no lowering in image quality was observed in each sample.

EXAMPLE 12

24 samples of image forming member for electrophotography (Sample Nos. 11-1-1C to 11-1-8C, 12-1-1C to 12-1-8C, and 13-1-1C to 13-1-8C) were prepared in the same manner and conditions as those for Samples Nos. 11-1C, 12-1C and 13-1C of Example 10 except for the respective conditions shown in Table 5C for forming the layer (II).

The thus prepared samples of image forming member for electrophotography were separately mounted on a copying apparatus and the overall image quality evaluation of the transferred image and durability evaluation by repeated use were conducted under the same conditions as described in the respective Examples for the respective samples of image forming member for electrophotography corresponding to the respective Examples.

Results of overall image quality evaluation of transferred image and durability evaluation of the respective samples by continuously repeated use are shown in Table 6C.

EXAMPLE 13

Samples of image forming member were prepared in the same manner as that for Sample No. 11-1C of Example 10 except that a target area ratio of silicon wafer:- SiO$_2$ was changed during the formation of the layer (II) to change a content ratio of silicon atoms to oxygen atoms in the layer (II). After about 50,000 repetitions of the steps of image forming, developing and cleaning as described in Example 10 for the thus prepared, respective samples of image forming member, the image quality evaluation was conducted. Results are shown in Table 7C.

EXAMPLE 14

Samples of image forming member were prepared in the same manner as that for Sample No. 12-1C of Example 10, except that a flow rate ratio of a SiH$_4$ gas to a NO gas changed during the formation of the layer (II) to change a content ratio of silicon atoms to the oxygen atoms in the layer (II).

After about 50,000 repetitions of the steps up to the transfer in the manner described in Example 10 for the thus prepared samples of image forming member, the image quality evaluation was conducted. Results are shown in table 8C.

EXAMPLE 15

Samples of image forming member were prepared in the same manner as that for Sample No. 13-1C of Example 10, except that a flow rate ratio of a SiH$_4$ gas:a SiF$_4$ gas:an NO gas was changed during the formation of the layer (II) to change a content ratio of silicon atoms to oxygen atoms in the layer (II). After about 50,000 repetions of the steps if image forming, developing and cleaning as described in Example 10 for the thus prepared samples of image forming member, the image quality evaluation was conducted. Results are shown in Table 9C.

EXAMPLE 16

Samples of image forming member were prepared in the same manner as that for Sample No. 11-1c of Example 10 except for changing the thickness of the layer (II).

The image forming, developing and cleaning as described in Example 10 were repeated for the thus prepared samples. Results of evaluation are shown in Table 10C.

EXAMPLE 17

By means of the apparatus shown in FIG. 21, respective samples of image forming members for electrophotography (Samples Nos. 11-1D to 17-3D: see Table 2D) were prepared, respectively, on cylindrical aluminum substrates under the conditions shown in Table 1D.

The content of germanium atoms and the content of nitrogen atoms in the respective samples are shown in FIG. 22 and FIG. 23, respectively.

Each of the samples thus obtained was set in a charging-exposure testing device and subjected to corona charging at ⊕ 5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing a toner and a carrier) was cascaded on the surface of the light receiving layer to give a good toner image on the surface of the light receiving layer. When the toner image was transferred onto a transfer paper by corona charging of ⊕ 5.0 KV, a clear image of high density with an excellent resolution and a good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 18

By means of the apparatus shown in FIG. 21, respective samples of image forming members for electrophotography (Samples Nos. 21-1D to 27-3D: see Table 4D) were prepared, respectively, on cylindrical aluminum substrates under the conditions shown in Table 3D.

The content of germanium atoms and the content of nitrogen atoms in the respective samples are shown in FIG. 22 and FIG. 23, respectively.

For each of these samples, the same image evaluation test as in Example 17 was conducted to give a toner transferred image of high quality in each sample. Also, for each sample, use test repeated for 200,000 times was performed under the environment of 38° C. and 80% RH. As the result, no lowering in image quality was observed in each sample.

EXAMPLE 19

By means of the apparatus shown in FIG. 21, respective samples of image forming member for electrophotography (Samples Nos. 11-1E to 17-3E: see Table 2E) were prepared on cylindrical aluminum substrates under the conditins shown in Table 1E.

The content of germanium atoms and the content of nitrogen atoms in the respective samples are shown in FIG. 22 and FIG. 23, respectively.

Each of the samples thus prepared was set in a charging-exposure testing device and subjected to corona charging at ⊕ 5.0 KV for 0.3 sec., followed immediately by irradiation of a light image. The light image was irradiated by means of a tungsten lamp light sourc at a dose of 2 lux.sec through a transmission test chart.

Immediately thereafter, ⊖ chargeable developer (containing a toner and a carrier) was cascaded on the surface of the sample (light receiving layer) to give a good toner image on the surface of the sample (light receiving layer). When the toner image was transferred onto a transfer paper by corona charging of ⊕ 5.0 KV, a clear image of high density with an excellent resolution and a good gradation reproducibility was obtained in every sample.

The same experiments were repeated under the same toner image forming coditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 20

By means of the apparatus shown in FIG. 21, respective samples of image forming members for electrophotography (Samples No. 21-1E to No. 27-3E; see Table 4E) were prepared, respectively, on cylindrical aluminum substrates under the conditions shown in Table 3E.

The content of germanium atoms and the content of nitrogen atoms in the respective samples are shown in FIG. 22 and FIG. 23, respectively.

For each of these samples, the same image evaluation test was conducted as in Example 19 to give a toner transferred image of high quality in each sample. Also, for each sample, use test with 200,000 repetitions was performed under the environment of 38° C. and 80% RH. As the result, no lowering in image quality was observed in each sample.

EXAMPLE 21

24 samples of image forming member for electrophotography (Samples Nos. 11-1-1E to 11-1-8E, 12-1-1E to 12-1-8E, and 13-1-E to 13-1-8E) were prepared in the same manner and conditions as those for Sample No. 11-1E, 12-1E and 13-1E of Example 19 except for the respective conditions shown in Table 5E for forming the layer (II).

The thus prepared samples of image forming member for electrophotography were separately mounted on a copying apparatus and the overall image quality evaluation of the transferred image and durability evaluation by repeated use were conducted under the same conditions as described in the respective Examples for the respective samples of image forming member for electrophotography corresponding to the respective Examples.

Results of overall image quality evaluation of transferred image and durability evaluation of the respective samples by continuously repeated use are shown in Table 6E.

EXAMPLE 22

Samples of image forming member was prepared in the same manner as that for Sample No. 11-1E of Example 19 except that a target area ratio of silicon wafer:-graphite was changed during the formation of the layer (II) to change a content ratio of silicon atoms to carbon atoms in the formula (II). After about 50,000 repetitions of the steps of image forming, developing and cleaning as described in Example 19 for the thus prepared, respective samples of image forming member, the image quality evaluation was conducted. Results are shown in Table 7E.

EXAMPLE 23

Samples of image forming member were prepared in the same manner as that for Sample No. 12-1E of Example 19 except that a flow rate ratio of a SiH$_4$ gas to a C$_2$H$_4$ gas was changed during the formation of the layer (II) to change a content ratio of silicon atoms to carbon atoms.

After about 50,000 repetitions of the steps up to the transfer in the manner as described in Example 19 for the thus prepared samples of image forming member, the image quality evaluation was conducted. Results are shown in Table 8E.

EXAMPLE 24

Samples of image forming member were prepared in the same menner as that for Sample No. 13-1E of Example 19 except that a flow rate ratio of a SiH$_4$ gas: a SiF$_4$ gas:a C$_2$H$_4$ gas was changed during the formation of the layer (II) to change the content ratio of silicon atoms to carbon atoms. After about 50,000 repetitions of the steps of image forming, developing and cleaning as described in Example 19 for the thus prepared samples of image forming member, the image quality evaluation was conducted. Results are shown in Table 9E.

EXAMPLE 25

Samples of image forming member were prepared in the same manner as that for Sample No. 11-1E of Example 19 except for changing the thickness of the layer (II). The image forming, developing and cleaning as described in Example 19 were repeated for the thus prepared samples. Result of evaluation are shown in Table 10E.

EXAMPLE 26

By means of the apparatus shown in FIG. 21, respective samples of image forming member for electrophotography (Samples Nos. 11-1F to 17-3F: see Table 2F) were prepared on cylindrical aluminum substrates under the conditions shown in Table 1F.

The content of germanium atoms and the content of nitrogen atoms in the respective samples are shown in FIG. 22 and FIG. 23, respectively.

Each of the samples thus prepared was set in a charging-exposure testing device and subjected to corona discharging at $\oplus$ 5.0 KV for 0.3 sec., followed immediately by irradiation of a light image. The light image was irradiated by means of a tungsten lamp light source at a dose of 2 lux.sec through a transmission test chart.

Immediately thereafter, $\ominus$ chargeable developer (containing a toner and a carrier) was cascaded on the surface of the sample (light receiving layer) to give a good toner image on the surface of the sample (light receiving layer). When the toner image was transferred onto a transfer paper by corona charging of $\oplus$ 5.0 KV, a clear image of high density with a excellent resolution and a good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 27

By means of the apparatus shown in FIG. 21, respective samples of image forming members for electrophotography (Samples Nos. 21-1F to 27-3F: see Table 4F) were prepared on cylindrical aluminum substrates under the conditions shown in Table 3F.

The contents of germanium atoms and the content of nitrogen atoms in the respective samples are shown in FIG. 22 and FIG. 23, respectively.

For each of these samples, the same image evaluation test as in Example 26 was conducted and a toner transferred image of high quality was obtained in each sample. Also, for each sample, use test with 200,000 repetitions was performed under the environment of 38° C. and 80% RH. As the result, no lowering in image quality was observed in each sample.

EXAMPLE 28

24 samples of image forming member for electrophotography (Samples Nos. 11-1-1F to 11-1-8F; 12-1-1F to 12-1-8F and 13-1-1F to 13-1-8F) were prepared in the same manner and conditions as those for Samples Nos. 11-1F, 12-1F and 13-1F of Example 26 except for the respective conditions shown in Table 5F for forming the layer (II).

The thus prepared samples of image forming member for electrophotography were separately mounted on a copying apparatus and the overall image quality evaluation of the transferred image and durability evaluation by repeated use were conducted under the same conditions and described in the respective Examples for the respective samples of image forming member for electrophotography corresponding to the respective Examples.

Results of overall image quality evaluation of transferred image and durability evaluation of the respective samples by continuously repeated use are shown in Table 6F.

EXAMPLE 29

Samples of image forming member were prepared in the same manner as that for Sample No. 11-1F of Example 26 except that a target area ratio of silicon wafer:-SiO$_2$ wafer was changed during the formation of the layer (II) to change a content ratio of silicon atoms to oxygen atoms in the layer (II). After about 50,000 repetitions of the steps of image forming developing and cleaning as described in Example 26, the image quality evaluation was conducted. Results are shown in Table 7F.

EXAMPLE 30

Samples of image forming member were prepared in the same manner as that for Sample No. 12-1F of Example 26 except that a flow rate ratio of a SiH$_4$ gas:an NO gas was changed during the formation of the layer (II) to change the content ratio of silicon atoms to oxygen atoms.

After about 50,000 repetitions of the steps up to the transfer in the manner described in Example 26 for the thus prepared samples of image forming member, the image quality evaluation was conducted. Results are shown in Table 8F.

EXAMPLE 31

Samples of image forming member were prepared in the same manner as that for Sample No. 13-1F of Example 26 except that a flow rate ratio of a SiH$_4$ gas:SiF$_4$ gas:an NO gas was changed during the formation of the layer (II) to change a content ratio of silicon atoms to oxygen atoms. After about 50,000 repetitions of the steps of image forming, developing and cleaning as described in Example 26 for the thus obtained, respective samples of image forming member, the image quality evaluation was conducted. Results are shown in Table 9F.

EXAMPLE 32

Samples of image forming member were prepared in the same manner as that for Sample No. 11-1F of Example 26 except for changing the thickness of the layer (II). After repetions of the steps of image forming, developing and cleaning as described in Example 26, evaluation was conducted. Results are shown in Table 10F.

Common conditions for forming the layer in the foregoing Examples according to the present invention are shown below:

Substrate temperature: about 200° C. for germanium atom (Ge)-containing layer, and about 250° C. for germanium atom (Ge)-free layer Discharge frequency: 13.56 MHz
Reaction chamber inside pressure during the reaction: 0.3 Torr

TABLE 1A

| Layer constitution | Gases employed | Flow rate (SCCM) | Flow rate ratio | Discharging power (W/cm$^2$) | Layer formation rate (Å/sec) | Layer thickness (μm) |
|---|---|---|---|---|---|---|
| Light receiving layer | SiF$_4$/He = 0.5<br>GeF$_4$/He = 0.5<br>NH$_3$<br>H$_2$ | SiF$_4$ + GeF$_4$ = 200 | $\frac{(SiF_4 + GeF_4)}{(H_2 + SiF_4 + GeF_4)} = 7/10$ | 0.18 | 15 | 25 |

TABLE 1B

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | SiF$_4$/He = 0.5<br>GeF$_4$/He = 0.5 | SiF$_4$ + GeF$_4$ = 200 | $\frac{GeF_4}{(H_2 + SiF_4 + GeF_4)} = (*)$ | 0.18 | 15 | 25 |
|  | NH$_3$<br>H$_2$ |  | $\frac{NH_3}{SiF_4 + GeF_4} = (**)$ |  |  |  |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

(\*), (\*\*) ... Flow rate ratio was changed with regard to each sample according to the flow rate ratio change rate curve previously designed by controlling automatically the opening of the corresponding valve.

TABLE 2A

| Depth profile of N | | Depth profile of Ge | |
|---|---|---|---|
| | Sample No. | 2201 | 2202 | 2203 |
| 2301 | | 11-1A | 12-1A | 13-1A |
| 2302 | | 11-2A | 12-2A | 13-2A |
| 2303 | | 11-3A | 12-3A | 13-3A |

TABLE 2B

| Depth profile of N | | Depth profile of Ge | |
|---|---|---|---|
| | Sample No. | 2201 | 2202 | 2203 |
| 2301 | | 11-1B | 12-1B | 13-1B |
| 2302 | | 11-2B | 12-2B | 13-2B |
| 2303 | | 11-3B | 12-3B | 13-3B |

TABLE 4A

| Depth profile of N | | Depth profile of Ge | |
|---|---|---|---|
| | Sample No. | 2201 | 2202 | 2203 |
| 2301 | | 21-1A | 22-1A | 23-1A |
| 2302 | | 21-2A | 22-2A | 23-2A |
| 2303 | | 21-3A | 22-3A | 23-3A |

TABLE 3A

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer region (I) | SiF$_4$/He = 0.5<br>GeF$_4$/He = 0.5<br>NH$_3$<br>H$_2$ | SiF$_4$ + GeF$_4$ = 200 | $\frac{(SiF_4 + GeF_4)}{(H_2 + SiF_4 + GeF_4)} = 7/10$ | 0.18 | 15 | 5 |
|  | B$_2$H$_6$/He = 10$^{-3}$ |  | $\frac{B_2H_6}{(SiF_4 + GeF_4)} = 2 \times 10^{-3}$ |  |  |  |
| Layer region (II) | SiF$_4$/He = 0.5<br>GeF$_4$/He = 0.5<br>NH$_3$<br>H$_2$ | SiF$_4$ + GeF$_4$ = 200 | $\frac{(SiF_4 + GeF_4)}{(H_2 + SiF_4 + GeF_4)} = 7/10$ | 0.18 | 15 | 20 |

TABLE 3B

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |

TABLE 3B-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer region | SiF$_4$/He = 0.5<br>GeF$_4$/He = 0.5<br>NH$_3$<br>H$_2$ | SiF$_4$ + GeF$_4$ = 200 | $\dfrac{GeF_4}{(H_2 + SiF_4 + GeF_4)} = (*)$ | 0.18 | 15 | 5 |
|  | B$_2$H$_6$/He = 1 × 10$^{-3}$ |  | $\dfrac{B_2H_6}{(SiF_4 + GeF_4)} = 2 \times 10^{-3}$ |  |  |  |
| Second layer region | SiF$_4$/He = 0.5<br>GeF$_4$/He = 0.5<br>NH$_3$<br>H$_2$ | SiF$_4$ + GeF$_4$ = 200 | $\dfrac{GeF_4}{(H_2 + SiF_4 + GeF_4)} = (*)$ | 0.18 | 15 | 20 |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

(*) ... Flow rate ratio was changed with regard to each sample according to the flow rate ratio change rate curve previously designed by controlling automatically the opening of the corresponding valve.

TABLE 4B

| Depth profile of N | Sample No. | Depth profile of Ge | | |
|---|---|---|---|---|
|  |  | 2201 | 2202 | 2203 |
|  | 2301 | 21-1B | 22-1B | 23-1B |
|  | 2302 | 21-2B | 22-2B | 23-2B |
|  | 2303 | 21-3B | 22-3B | 23-3B |

TABLE 5B

| Conditions | Gases employed | Flow rate (SCCM) | Flow rate ratio or area ratio | Discharging power (W/cm$^2$) | Layer thickness ($\mu$) |
|---|---|---|---|---|---|
| 5-1B | Ar | 200 | Si wafer:graphite = 1.5:8.5 | 0.3 | 0.5 |
| 5-2B | Ar | 200 | Si wafer:graphite = 0.5:9.5 | 0.3 | 0.3 |
| 5-3B | Ar | 200 | Si wafer:graphite = 6:4 | 0.3 | 1.0 |
| 5-4B | SiH$_4$/He = 1<br>C$_2$H$_4$ | SiH$_4$ = 15 | SiH$_4$:C$_2$H$_4$ = 0.4:9.6 | 0.18 | 0.3 |
| 5-5B | SiH$_4$/He = 0.5<br>C$_2$H$_4$ | SiH$_4$ = 100 | SiH$_4$:C$_2$H$_4$ = 5:5 | 0.18 | 1.5 |
| 5-6B | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 1.5:1.5:7 | 0.18 | 0.5 |
| 5-7B | SiH$_4$/He = 0.5<br>SiF$_4$/He = 0.5<br>C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 5-8B | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 3:3:4 | 0.18 | 1.5 |

TABLE 6B

| Layer (II) forming conditions | Sample No./Evaluation | | |
|---|---|---|---|
| 5-1B | 11-1-1B ○ ○ | 12-1-1B ○ ○ | 13-1-1B ○ ○ |
| 5-2B | 11-1-2B ○ ○ | 12-1-2B ○ ○ | 13-1-2B ○ ○ |
| 5-3B | 11-1-3B ○ ○ | 12-1-3B ○ ○ | 13-1-3B ○ ○ |
| 5-4B | 11-1-4B ◉ ◉ | 12-1-4B ◉ ◉ | 13-1-4B ◉ ◉ |
| 5-5B | 11-1-5B ◉ ◉ | 12-1-5B ◉ ◉ | 13-1-5B ◉ ◉ |
| 5-6B | 11-1-6B ◉ ◉ | 12-1-6B ◉ ◉ | 13-1-6B ◉ ◉ |
| 5-7B | 11-1-7B ○ ○ | 12-1-7B ○ ○ | 13-1-7B ○ ○ |
| 5-8B | 11-1-8B ○ ○ | 12-1-8B ○ ○ | 13-1-8B ○ ○ |

Sample No.
Overall image quality evaluation   Durability evaluation
Evaluation standard:
◉ Excellent
○ Good

TABLE 7B

| Sample No. | 1301B | 1302B | 1303B | 1304B | 1305B | 1306B | 1307B |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality | Δ | ○ | ◉ | ◉ | ○ | Δ | x |

TABLE 7B-continued

| Sample No. | 1301B | 1302B | 1303B | 1304B | 1305B | 1306B | 1307B |
|---|---|---|---|---|---|---|---|
| evaluation | | | | | | | |

⊙: Very good
○: Good
Δ: Sufficiently practically usable
x: Image defect formed

TABLE 8B

| Sample No. | 1401B | 1402B | 1403B | 1404B | 1405B | 1406B | 1407B | 1408B |
|---|---|---|---|---|---|---|---|---|
| $SiH_4:C_2H_4$ (Flow rate ratio) | 9:1 | 6:4 | 4:6 | 2:8 | 1:9 | 0.5:9.5 | 0.35:9.65 | 0.2:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Sufficiently practically usable
x: Image defect formed

TABLE 9B

| Sample No. | 1501B | 1502B | 1503B | 1504B | 1505B | 1506B | 1507B | 1508B |
|---|---|---|---|---|---|---|---|---|
| $SiH_4:SiF_4:C_2H_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Sufficiently practically usable
x: Image defect formed

TABLE 10B

| Sample No. | Thickness of layer (II) (μ) | Results |
|---|---|---|
| 1601B | 0.001 | Image defect liable to be formed |
| 1602B | 0.02 | No image defect formed up to successive copying for 20,000 times |
| 1603B | 0.05 | Stable up to successive copying for 50,000 times |
| 1604B | 1 | Stable up to successive copying for 200,000 times |

TABLE 2C

| Depth profile of N Sample No. | Depth profile of Ge | | |
|---|---|---|---|
| | 2201 | 2202 | 2203 |
| 2301 | 11-1C | 12-1C | 13-1C |
| 2302 | 11-2C | 12-2C | 13-2C |
| 2303 | 11-3C | 12-3C | 13-3C |

TABLE 1C

| Layer constitution | Gases employed | Flow rate (SCCM) | Flow rate ratio | Discharging power (W/cm²) | Layer formation rate (Å/sec) | Layer thickness (μ) |
|---|---|---|---|---|---|---|
| Layer region (I) | $SiF_4/He = 0.5$<br>$GeF_4/He = 0.5$ | $SiF_4 + GeF_4 = 200$ | $\dfrac{GeF_4}{(H_2 + SiF_4 + GeF_4)} = (*)$ | 0.18 | 15 | 25 |
| | $NH_3$<br>$H_2$ | | $\dfrac{NH_3}{SiF_4 + GeF_4} = (**)$ | | | |
| Layer region (II) | $SiH_4/He = 0.5$<br>NO | $SiH_4 = 100$ | $SiH_4/NO = 3/7$ | 0.18 | 10 | 0.5 |

(*), (**) ... Flow rate ratio was changed with regard to each sample according to the flow rate ratio change rate curve previously designed by controlling automatically the opening of the corresponding valve.

TABLE 3C

| Layer constitution | Gases employed | Flow rate (SCCM) | Flow rate ratio | Discharging power (W/cm²) | Layer formation rate (Å/sec) | Layer thickness (μ) |
|---|---|---|---|---|---|---|
| Layer (I) | | | | | | |
| First layer region | $SiF_4/He = 0.5$<br>$GeF_4/He = 0.5$ | $SiF_4 + GeF_4 = 200$ | $\dfrac{GeF_4}{(H_2 + SiF_4 + GeF_4)} = (*)$ | 0.18 | 15 | 5 |

TABLE 3C-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| | NH$_3$<br>H$_2$<br>B$_2$H$_6$/He = 1 × 10 | | $\frac{B_2H_6}{(SiF_4 + GeF_4)} = 2 \times 10^{-3}$ | | | |
| Second layer region | SiF$_4$/He = 0.5<br>GeH$_4$/He = 0.5<br>NH$_3$<br>H$_2$ | SiF$_4$ + GeF$_4$ = 200 | $\frac{GeF_4}{(H_2 + SiF_4 + GeF_4)} = *$ | 0.18 | 15 | 20 |
| Layer (II) | SiH$_4$/He = 0.5<br>NO | SiH$_4$ = 100 | SiH$_4$/NO = 3/7 | 0.18 | 10 | 0.5 |

(*) ... Flow rate ratio was changed with regard to each sample according to the flow rate ratio change rate curve previously designed by controlling automatically the opening of the corresponding valve.

TABLE 4C

| Depth profile of N | | Depth profile of Ge | |
|---|---|---|---|
| Sample No. | 2201 | 2202 | 2203 |
| 2301 | 21-1C | 22-1C | 23-1C |
| 2302 | 21-2C | 22-2C | 23-2C |
| 2303 | 21-3C | 22-3C | 23-3C |

TABLE 5C

| Conditions | Gases employed | Flow rate (SCCM) | Flow rate ratio or area ratio | Discharging power (W/cm$^2$) | Layer thickness ($\mu$) |
|---|---|---|---|---|---|
| 5-1C | Ar | 200 | Si wafer:SiO$_2$ = 1:30 | 0.3 | 0.5 |
| 5-2C | Ar | 200 | Si wafer:SiO$_2$ = 1:60 | 0.3 | 0.3 |
| 5-3C | Ar | 200 | Si wafer:SiO$_2$ = 6:4 | 0.3 | 1.0 |
| 5-4C | SiH$_4$/He = 1<br>NO | SiH$_4$ = 15 | SiH$_4$:NO = 5:1 | 0.18 | 0.3 |
| 5-5C | SiH$_4$/He = 1<br>NO | SiH$_4$ = 100 | SiH$_4$:NO = 1:1 | 0.18 | 1.5 |
| 5-6C | SiH$_4$/He = 0.5<br>SiF$_4$/He = 0.5<br>NO | SiH$_4$ + SiF$_4$ = 150 | SiH$_4$:SiF$_4$:NO = 1:1:1 | 0.18 | 0.5 |
| 5-7C | SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 5-8C | SiH$_4$/He = 0.5<br>SiF$_4$/He = 0.5<br>NO | SiH$_4$ + SiF$_4$ = 150 | SiH$_4$:SiF$_4$:NO = 1:1:3 | 0.18 | 1.5 |

TABLE 6C

| Layer (II) forming conditions | Sample No./Evaluation | | |
|---|---|---|---|
| 5-1C | 11-1-1C ⊙ ○ | 12-1-1C ⊙ ○ | 13-1-1C |
| 5-2C | 11-1-2C ○ ○ | 12-1-2C ○ ○ | 13-1-2C |
| 5-3C | 11-1-3C ○ ○ | 12-1-3C ○ ○ | 13-1-3C |
| 5-4C | 11-1-4C ⊙ ⊙ | 12-1-4C ⊙ ⊙ | 13-1-4C ⊙ ⊙ |
| 5-5C | 11-1-5C ⊙ ⊙ | 12-1-5C ⊙ ⊙ | 13-1-5C ⊙ ⊙ |
| 5-6C | 11-1-6C ⊙ ⊙ | 12-1-6C ⊙ ⊙ | 13-1-6C ⊙ ⊙ |
| 5-7C | 11-1-7C ○ ○ | 12-1-7C ○ ○ | 13-1-7C ○ ○ |
| 5-8C | 11-1-8C ○ ○ | 12-1-8C ○ ○ | 13-1-8C ○ ○ |

Sample No.
Overall image quality evaluation  Durability evaluation
Evaluation standard:
⊙ Excellent
○ Good

TABLE 7C

| Sample No. | 1301C | 1302C | 1303C | 1304C | 1305C | 1306C | 1307C |
|---|---|---|---|---|---|---|---|
| Si:SiO$_2$ Target (Area ratio) (NO/Ar) | 9:1 (0/1) | 6.5:3.5 (1/1) | 4:10 (1/1) | 2:60 (1/1) | 1:100 (2/1) | 1:100 (3/1) | 1:100 (4/1) |
| Si:O (Content ratio) | 9.7:0.3 | 8.8:1.2 | 7.3:2.7 | 5.0:5.0 | 4.5:5.5 | 4:6 | 3:7 |
| Image quality evaluation | Δ | ⊙ | ⊙ | ○ | ○ | Δ | x |

⊙: Very good
○: Good
Δ: Sufficiently practically usable
x: Image defect formed

TABLE 8C

| Sample No. | 1401C | 1402C | 1403C | 1404C | 1405C | 1406C | 1407C |
|---|---|---|---|---|---|---|---|
| $SiH_4:NO$ (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image quality evaluation | Δ | ○ | ◎ | ◎ | ○ | Δ | x |

◎: Very good
○: Good
Δ: Sufficiently practically usable
x: Image defect formed

TABLE 9C

| Sample No. | 1501C | 1502C | 1503C | 1504C | 1505C | 1506C | 1507C |
|---|---|---|---|---|---|---|---|
| $SiH_4:SiF_4:NO$ (Flow rate ratio) | 500:400:1 | 50:50:1 | 5:5:2 | 5:5:10 | 1:1:4 | 3:3:20 | 1:1:20000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality evaluation | Δ | ○ | ◎ | ◎ | ○ | Δ | x |

◎: Very good
○: Good
Δ: Sufficiently practically usable
x: Image defect formed

TABLE 10C

| Sample No. | Thickness of layer (II) (μ) | Results |
|---|---|---|
| 1601C | 0.001 | Image defect liable to be formed |
| 1602C | 0.02 | No image defect formed up to successive copying for 20,000 times |
| 1603C | 0.05 | Stable up to successive copying for 50,000 times |
| 1604C | 1 | Stable up to successive copying for 200,000 times |

TABLE 1D

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | $SiH_4/He$ = 0.5<br>$GeH_4/He$ = 0.5<br>$NH_3$ | $SiH_4 + GeH_4$ = 200 | — | 0.18 | 15 | 5 |
| Layer (II) | $SiH_4/He$ = 0.5<br>$NH_3$ | $SiH_4$ = 200 | — | 0.18 | 15 | 23 |

TABLE 2D

| Depth profile of N Sample No. | Depth profile of Ge | | | | | | |
|---|---|---|---|---|---|---|---|
| | 2401 | 2402 | 2403 | 2404 | 2405 | 2406 | 2407 |
| 2301 | 11-1D | 12-1D | 13-1D | 14-1D | 15-1D | 16-1D | 17-1D |
| 2302 | 11-2D | 12-2D | 13-2D | 14-2D | 15-2D | 16-2D | 17-2D |
| 2303 | 11-3D | 12-3D | 13-3D | 14-3D | 15-3D | 16-3D | 17-3D |

TABLE 3D

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer region (I) | $SiH_4/He$ = 0.5<br>$GeH_4/He$ = 0.5<br>$NH_3$<br>$B_2H_6/He$ = $10^{-3}$ | $SiH_4 + GeH_4$ = 200 | — | 0.18 | 15 | 3 |
| Layer region (II) | $SiH_4/He$ = 0.5<br>$NH_3$ | $SiH_4$ = 200 | — | 0.18 | 15 | 25 |

TABLE 4D

| Depth profile of N | Sample No. | Depth profile of Ge | | | | | | |
|---|---|---|---|---|---|---|---|---|
| | | 2401 | 2402 | 2403 | 2404 | 2405 | 2406 | 2407 |
| | 2301 | 21-1D | 22-1D | 23-1D | 24-1D | 25-1D | 26-1D | 27-1D |
| | 2302 | 21-2D | 22-2D | 23-2D | 24-2D | 25-2D | 26-2D | 27-2D |
| | 2303 | 21-3D | 22-3D | 23-3D | 24-3D | 25-3D | 26-3D | 27-3D |

TABLE 1E

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region (G) | SiH$_4$/He = 0.5<br>GeH$_4$/He = 0.5<br>NH$_3$ | SiH$_4$ + GeH$_4$ = 200 | $\frac{GeH_4}{SiH_4 + GeH_4} = (*)$<br><br>$\frac{NH_3}{SiH_4 + NH_3} = (**)$ | 0.18 | 15 | 3 |
| Second layer region (S) | SiH$_4$/He = 0.5<br>NH$_3$ | SiH$_4$ = 200 | $\frac{NH_3}{SiH_4 + NH_3} = (**)$ | 0.18 | 15 | 25 |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

(*), (**) ... Flow rate ratio was changed with regard to each sample according to the flow rate ratio change rate curve previously designed by controlling automatically the opening of the corresponding valve.

TABLE 2E

| Depth profile of N | Sample No. | Depth profile of Ge | | | | | | |
|---|---|---|---|---|---|---|---|---|
| | | 2401 | 2402 | 2403 | 2404 | 2405 | 2406 | 2407 |
| | 2301 | 11-1E | 12-1E | 13-1E | 14-1E | 15-1E | 16-1E | 17-1E |
| | 2302 | 11-2E | 12-2E | 13-2E | 14-2E | 15-2E | 16-2E | 17-2E |
| | 2303 | 11-3E | 12-3E | 13-3E | 14-3E | 15-3E | 16-3E | 17-3E |

TABLE 3E

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region (G) | SiH$_4$/He = 0.5<br>GeH$_4$/He = 0.5<br>NH$_3$<br>B$_2$H$_6$/He = 10 | SiH$_4$ + GeH$_4$ = 200 | $\frac{GeH_4}{SiH_4 + GeH_4} = (*)$<br><br>$\frac{NH_3}{SiH_4 + NH_3} = (**)$<br><br>$\frac{B_2H_6}{SiH_4 + GeH_4} = 3 \times 10^{-3}$ | 0.18 | 15 | 3 |
| Second layer region (S) | SiH$_4$/He = 0.5<br>NH$_3$ | SiH$_4$ = 200 | $\frac{NH_3}{SiH_4 + NH_3} = (**)$ | 0.18 | 15 | 25 |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

(*), (**) ... Flow rate ratio was changed with regard to each sample according to the flow rate ratio change rate curve previously designed by controlling automatically the opening of the corresponding valve.

TABLE 4E

| Depth profile of N | Sample No. | Depth profile of Ge | | | | | | |
|---|---|---|---|---|---|---|---|---|
| | | 2401 | 2402 | 2403 | 2404 | 2405 | 2406 | 2407 |
| | 2301 | 21-1E | 22-1E | 23-1E | 24-1E | 25-1E | 26-1E | 27-1E |
| | 2302 | 21-2E | 22-2E | 23-2E | 24-2E | 25-2E | 26-2E | 27-2E |
| | 2303 | 21-3E | 22-3E | 23-3E | 24-3E | 25-3E | 26-3E | 27-3E |

TABLE 5E

| Conditions | Gases employed | Flow rate (SCCM) | Flow rate ratio or area ratio | Discharging power (W/cm$^2$) | Layer thickness ($\mu$) |
|---|---|---|---|---|---|
| 5-1E | Ar | 200 | Si wafer:graphite = 1.5:8.5 | 0.3 | 0.5 |
| 5-2E | Ar | 200 | Si wafer:graphite = 0.5:9.5 | 0.3 | 0.3 |
| 5-3E | Ar | 200 | Si wafer:graphite = 6:4 | 0.3 | 1.0 |
| 5-4E | SiH$_4$/He = 1 C$_2$H$_4$ | SiH$_4$ = 15 | SiH$_4$:C$_2$H$_4$ = 0.4:9.6 | 0.18 | 0.3 |
| 5-5E | SiH$_4$/He = 0.5 C$_2$H$_4$ | SiH$_4$ = 100 | SiH$_4$:C$_2$H$_4$ = 5:5 | 0.18 | 1.5 |
| 5-6E | SiH$_4$/He = 0.5 SiF$_4$/He = 0.5 C$_2$H$_4$ | SiH$_4$ + SiF$_4$ = 150 | SiH$_4$:SiF$_4$:C$_2$H$_4$ = 1.5:1.5:7 | 0.18 | 0.5 |
| 5-7E | SiH$_4$/He = 0.5 SiF$_4$/He = 0.5 C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 5-8E | SiH$_4$/He = 0.5 SiF$_4$/He = 0.5 C$_2$H$_4$ | SiH$_4$ + SiF$_4$ = 150 | SiH$_4$:SiF$_4$:C$_2$H$_4$ = 3:3:4 | 0.18 | 1.5 |

TABLE 6E

| Layer (II) forming conditions | Sample No./Evaluation | | |
|---|---|---|---|
| 5-1E | 11-1-1E ○ ○ | 12-1-1E ○ ○ | 13-1-1E ○ ○ |
| 5-2E | 11-1-2E ○ ○ | 12-1-2E ○ ○ | 13-1-2E ○ ○ |
| 5-3E | 11-1-3E ○ ○ | 12-1-3E ○ ○ | 13-1-3E ○ ○ |
| 5-4E | 11-1-4E ⊙ ⊙ | 12-1-4E ⊙ ⊙ | 13-1-4E ⊙ ⊙ |
| 5-5E | 11-1-5E ⊙ ⊙ | 12-1-5E ⊙ ⊙ | 13-1-5E ⊙ ⊙ |
| 5-6E | 11-1-6E ⊙ ⊙ | 12-1-6E ⊙ ⊙ | 13-1-6E ⊙ ⊙ |
| 5-7E | 11-1-7E ○ ○ | 12-1-7E ○ ○ | 13-1-7E ○ ○ |
| 5-8E | 11-1-8E ○ ○ | 12-1-8E ○ ○ | 13-1-8E ○ ○ |

Sample No. — Overall image quality evaluation — Durability evaluation
Evaluation standard:
⊙ Excellent
○ Good

TABLE 7E

| Sample No. | 1301E | 1302E | 1303E | 1304E | 1305E | 1306E | 1307E |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | △ | ○ | ⊙ | ⊙ | ○ | △ | x |

⊙: Very good
○: Good
△: Sufficiently practically usable
x: Image defect formed

TABLE 8E

| Sample No. | 1401E | 1402E | 1403E | 1404E | 1405E | 1406E | 1407E | 1408E |
|---|---|---|---|---|---|---|---|---|
| SiH$_4$:C$_2$H$_4$ (Flow rate ratio) | 9:1 | 6:4 | 4:6 | 2:8 | 1:9 | 0.5:9.5 | 0.35:9.65 | 0.2:9.8 |
| Si:C (Content ratio) | 9:1 | 7:3 | 5.5:4.5 | 4:6 | 3:7 | 2:8 | 1.2:8.8 | 1.2:8.8 |
| Image quality evaluation | △ | ○ | ⊙ | ⊙ | ⊙ | ○ | △ | x |

⊙: Very good
○: Good
△: Sufficiently practically usable
x: Image defect formed

TABLE 9E

| Sample No. | 1501E | 1502E | 1503E | 1504E | 1505E | 1506E | 1507E | 1508E |
|---|---|---|---|---|---|---|---|---|
| SiH$_4$:SiF$_4$:C$_2$H$_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image quality | △ | ○ | ⊙ | ⊙ | ⊙ | ○ | △ | x |

TABLE 9E-continued

| Sample No. | 1501E | 1502E | 1503E | 1504E | 1505E | 1506E | 1507E | 1508E |
|---|---|---|---|---|---|---|---|---|
| evaluation | | | | | | | | |

◎: Very good
○: Good
Δ: Sufficiently practically usable
x: Image defect formed

TABLE 10E

| Sample No. | Thickness of layer (II) ($\mu$) | Results |
|---|---|---|
| 1601E | 0.001 | Image defect liable to be formed |
| 1602E | 0.02 | No image defect formed up to successive copying for 20,000 times |
| 1603E | 0.05 | Stable up to successive copying for 50,000 times |
| 1604E | 1 | Stable up to successive copying for 200,000 times |

TABLE 1F

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region (G) | $SiH_4/He = 0.5$ $GeH_4/He = 0.5$ $NH_3$ | $SiH_4 + GeH_4 = 200$ | $\dfrac{GeH_4}{SiH_4 + GeH_4} = (*)$ $\dfrac{NH_3}{SiH_4 + NH_3} = (**)$ | 0.18 | 15 | 3 |
| Second layer region (S) | $SiH_4/He = 0.5$ $NH_3$ | $SiH_4 = 200$ | $\dfrac{NH_3}{SiH_4 + NH_3} = (**)$ | 0.18 | 15 | 25 |
| Layer (II) | $SiH_4/He = 0.5$ NO | $SiH_4 = 100$ | $SiH_4/NO = 3/7$ | 0.18 | 10 | 0.5 |

(*), (**) ... Flow rate ratio was changed with regard to each sample according to the flow rate ratio change rate curve previously designed by controlling automatically the opening of the corresponding valve.

TABLE 2F

| Depth profile of N | Sample No. | Depth profile of Ge | | | | | | |
|---|---|---|---|---|---|---|---|---|
| | | 2401 | 2402 | 2403 | 2404 | 2405 | 2406 | 2407 |
| | 2301 | 11-1F | 12-1F | 13-1F | 14-1F | 15-1F | 16-1F | 17-1F |
| | 2302 | 11-2F | 12-2F | 13-2F | 14-2F | 15-2F | 16-2F | 17-2F |
| | 2303 | 11-3F | 12-3F | 13-3F | 14-3F | 15-3F | 16-3F | 17-3F |

TABLE 3F

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region (G) | $SiH_4/He = 0.5$ $GeH_4/He = 0.5$ $NH_3$ $B_2H_6/He = 10$ | $SiH_4 + GeH_4 = 200$ | $\dfrac{GeH_4}{SiH_4 + GeH_4} = (*)$ $\dfrac{NH_3}{SiH_4 + NH_3} = (**)$ $\dfrac{B_2H_6}{SiH_4 + GeH_4} = 3 \times 10^{-3}$ | 0.18 | 15 | 3 |
| Second layer region (S) | $SiH_4/He = 0.5$ $NH_3$ | $SiH_4 = 200$ | $\dfrac{NH_3}{SiH_4 + NH_3} = (**)$ | 0.18 | 15 | 25 |
| Layer (II) | $SiH_4/He = 0.5$ NO | $SiH_4 = 100$ | $SiH_4/NO = 3/7$ | 0.18 | 10 | 0.5 |

(*), (**) ... Flow rate ratio was changed with regard to each sample according to the flow rate ratio change rate curve previously designed by controlling automatically the opening of the corresponding valve.

TABLE 4F

| Depth profile of N | Sample No. | Depth profile of Ge | | | | | | |
|---|---|---|---|---|---|---|---|---|
| | | 2401 | 2402 | 2403 | 2404 | 2405 | 2406 | 2407 |
| | 2301 | 21-1F | 22-1F | 23-1F | 24-1F | 25-1F | 26-1F | 27-1F |
| | 2302 | 21-2F | 22-2F | 23-2F | 24-2F | 25-2F | 26-2F | 27-2F |
| | 2303 | 21-3F | 22-3F | 23-3F | 24-3F | 25-3F | 26-3F | 27-3F |

TABLE 5F

| Conditions | Gases employed | Flow rate (SCCM) | Flow rate ratio or area ratio | Discharging power (W/cm$^2$) | Layer thickness ($\mu$) |
|---|---|---|---|---|---|
| 5-1F | Ar | 200 | Si wafer:SiO$_2$ = 1:30 | 0.3 | 0.5 |
| 5-2F | Ar | 200 | Si wafer:SiO$_2$ = 1:60 | 0.3 | 0.3 |
| 5-3F | Ar | 200 | Si wafer:SiO$_2$ = 6:4 | 0.3 | 1.0 |
| 5-4F | SiH$_4$/He = 1<br>NO | SiH$_4$ = 15 | SiH$_4$:NO = 5:1 | 0.18 | 0.3 |
| 5-5F | SiH$_4$/He = 0.5<br>NO | SiH$_4$ = 100 | SiH$_4$:NO = 1:1 | 0.18 | 1.5 |
| 5-6C | SiH$_4$/He = 0.5<br>SiF$_4$/He = 0.5<br>NO | SiH$_4$ + SiF$_4$ = 150 | SiH$_4$:SiF$_4$:NO = 1:1:1 | 0.18 | 0.5 |
| 5-7C | SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 5-8C | SiH$_4$/He = 0.5<br>SiF$_4$/He = 0.5<br>NO | SiH$_4$ + SiF$_4$ = 150 | SiH$_4$:SiF$_4$:NO = 1:1:3 | 0.18 | 1.5 |

TABLE 6F

| Layer (II) forming conditions | Sample No./Evaluation | | |
|---|---|---|---|
| 5-1F | 11-1-1F ○ ○ | 12-1-1F ○ ○ | 13-1-1F ○ ○ |
| 5-2F | 11-1-2F ○ ○ | 12-1-2F ○ ○ | 13-1-2F ○ ○ |
| 5-3F | 11-1-3F ○ ○ | 12-1-3F ○ ○ | 13-1-3F ○ ○ |
| 5-4F | 11-1-4F ◉ ◉ | 12-1-4F ◉ ◉ | 13-1-4F ◉ ◉ |
| 5-5F | 11-1-5F ◉ ◉ | 12-1-5F ◉ ◉ | 13-1-5F ◉ ◉ |
| 5-6F | 11-1-6F ◉ ◉ | 12-1-6F ◉ ◉ | 13-1-6F ◉ ◉ |
| 5-7F | 11-1-7F ○ ○ | 12-1-7F ○ ○ | 13-1-7F ○ ○ |
| 5-8F | 11-1-8F ○ ○ | 12-1-8F ○ ○ | 13-1-8F ○ ○ |

Sample No. Overall image quality evaluation Durability evaluation
Evaluation standard:
◉ Excellent
○ Good

TABLE 7F

| Sample No. | 1301F | 1302F | 1303F | 1304F | 1305F | 1306F | 1307F |
|---|---|---|---|---|---|---|---|
| Si:SiO$_2$ Target (Area ratio) | 9:1 | 6.5:3.5 | 4:10 | 2:60 | 1:100 | 1:100 | 1:100 |
| (NO/Ar) | (0/1) | (1/1) | (1/1) | (1/1) | (2/1) | (3/1) | (4/1) |
| Si:O (Content ratio) | 9.7:0.3 | 8.8:1.2 | 7.3:2.7 | 5.0:5.0 | 4.5:5.5 | 4:6 | 3:7 |
| Image quality evaluation | Δ | ◉ | ◉ | ○ | ○ | Δ | x |

◉: Very good
○: Good
Δ: Sufficiently practically usable
x: Image defect formed

TABLE 8F

| Sample No. | 1401F | 1402F | 1403F | 1404F | 1405F | 1406F | 1407F |
|---|---|---|---|---|---|---|---|
| SiH$_4$:NO (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image quality evaluation | Δ | ○ | ◉ | ◉ | ○ | Δ | x |

◉: Very good
○: Good
Δ: Sufficiently practically usable
x: Image defect formed

TABLE 9F

| Sample No. | 1501F | 1502F | 1503F | 1504F | 1505F | 1506F | 1507F |
|---|---|---|---|---|---|---|---|
| $SiH_4:SiF_4:NO$ (Flow rate ratio) | 500:400:1 | 50:50:1 | 5:5:2 | 5:5:10 | 1:1:4 | 3:3:20 | 1:1:20000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality evaluation | Δ | ○ | ⊚ | ⊚ | ○ | Δ | x |

⊚: Very good
○: Good
Δ: Sufficiently practically usable
x: Image defect formed

TABLE 10F

| Sample No. | Thickness of layer (II) (μ) | Results |
|---|---|---|
| 1601F | 0.001 | Image defect liable to be formed |
| 1602F | 0.02 | No image defect formed up to successive copying for 20,000 times |
| 1603F | 0.05 | Stable up to successive copying for 50,000 times |
| 1604F | 1 | Stable up to successive copying for 200,000 times |

What we claim is:

1. A photoconductive member which comprises a substrate for the photoconductive member and a light receiving layer exhibiting photoconductivity provided on said substrate comprising an amorphous material containing silicon atoms, germanium atoms and from 0.01 to 40 atomic percent of at least one of hydrogen atoms and halogen atoms, the light receiving layer having a layer region (N) containing nitrogen atoms, and the layer region (N) having a region (X) in which the content C (N) of nitrogen atoms in the layer thickness direction smoothly and continuously increases toward the upper surface of the light receiving layer, wherein the maximum value Cmax of the content C(N) of nitrogen atoms exists at one end surface of layer region (N).

2. A photoconductive member according to claim 1, wherein the layer region (N) has, under the region (X), a region (Y) in which the content C (N) continuously increases toward the substrate side.

3. A photoconductive member according to claim 1, wherein hydrogen atoms are contained in the light receiving layer.

4. A photoconductive member according to claim 1, wherein halogen atoms are contained in the light receiving layer.

5. A photoconductive member according to claim 1, wherein the content of germanium atoms in the layer thickness direction in non-uniform in the light receiving layer.

6. A photoconductive member according to claim 1, wherein the content of germanium atoms in the layer thickness direction is uniform in the light receiving layer.

7. A photoconductive member according to claim 1, wherein a conductivity-controlling substance (C) is contained in the light receiving layer.

8. A photoconductive member according to claim 6, wherein the conductivity-controlling substance (C) is an atom belonging to Group III of the periodic table.

9. A photoconductive member according to claim 6, wherein the conductivity-controlling substance (C) is an atom belonging to Group V of the periodic table.

10. A photoconductive member according to claim 1, wherein maximum value Cmax of the content C of germanium atoms in the layer thickness direction in the light receiving layer is in a layer region within the depth of $5\mu$ from the end surface on the substrate side of the light receiving layer.

11. A photoconductive member according to claim 10, wherein the maximum value Cmax is 1000 atomic ppm or more on the basis of sum total with silicon atoms.

12. A photoconductive member according to claim 1, wherein the content of germanium atoms existing in the light receiving layer is 1 to $9.5 \times 10^5$ atomic ppm on the basis of sum total with silicon atoms.

13. A photoconductive member according to claim 1, wherein the content of nitrogen atoms existing in the layer region (N) is 0.001 to 50 atomic % on the basis of sum total T (SiGeN) of silicon atoms, germanium atoms and nitrogen atoms.

14. A photoconductive member according to claim 1, wherein, when a ratio of thickness To of the layer region (N) to thickness T of the light receiving layer is 2/5 or more, an upper limit to the content of nitrogen atoms existing in the layer region (N) is 30 atomic % or less on the basis of sum total T (SiGeN) of silicon atoms, germanium atoms and nitrogen atoms.

15. A photoconductive member according to claim 1, wherein the layer region (N) has a localized region (B) containing nitrogen atoms in a higher content toward the substrate side and/or toward the free surface side.

16. A photoconductive member according to claim 15, wherein the localized region (B) is provided within the depth of $5\mu$ from the end surface of the substrate side of the light receiving layer.

17. A photoconductive member according to claim 15, wherein the localized region (B) is provided within the depth of $5\mu$ from the free surface side of the light receiving layer.

18. A photoconductive member according to claim 15, wherein the maximum value Cmax of the content C (N) of nitrogen atoms in the localized region (B) is 500 atomic ppm or more.

19. A photoconductive member according to claim 1, wherein the light receiving layer contains a p-type impurity.

20. A photoconductive member according to claim 1, wherein the p-type impurity is B, Al, Ga or In.

21. A photoconductive member according to claim 19, wherein the content of the p-type impurity is 0.01 to $5 \times 10^4$ atomic ppm.

22. A photoconductive member according to claim 1, wherein the light receiving layer contains an n-type impurity.

23. A photoconductive member according to claim 22, wherein the content of the n-type impurity is 0.01 to $5 \times 10^4$ atomic ppm.

24. A photoconductive member according to claim 1, wherein the light receiving layer has a layer region (PN) containing a conductivity-controlling substance (C) at the end part on the substrate side.

25. A photoconductive member according to claim 24, wherein the content of the substance (C) existing in the layer region (PN) is 0.01 to $5 \times 10^4$ atomic ppm.

26. A photoconductive member according to claim 24, wherein the light receiving layer has a layer region (Z) in contact with the layer region (PN), the layer region (Z) containing a substance controlling conductive characteristics of opposite polarity to that of the substance (C) existing in the layer region (PN).

27. A photoconductive member according to claim 24, wherein the light receiving layer has a layer region (Z) in contact with the layer region (PN), the layer region (Z) containing a substance controlling conductive characteristics of same polarity as that of the substance existing in the layer region (PN) in a smaller content than that of the substance (C) existing in the layer region (PN).

28. A photoconductive member according to claim 1, wherein the light receiving layer contains 0.01 to 40 atomic % of hydrogen atoms.

29. A photoconductive member according to claim 1, wherein the light receiving layer contains 0.01 to 40 atomic % of halogen atoms.

30. A photoconductive member according to claim 1, wherein the light receiving layer contains 0.01 to 40 atomic % of hydrogen atoms and halogen atoms in total.

31. A photoconductive member according to claim 1, wherein the light receiving layer has a layer thickness of 1 to 100$\mu$.

32. A photoconductive member according to claim 1, wherein the layer region (N) contains oxygen atoms.

33. A photoconductive member according to claim 1, wherein the substrate is electroconductive.

34. A photoconductive member according to claim 1, wherein the substrate is electro-insulating.

35. A photoconductive member according to claim 1, wherein the substrate is cylindrical.

36. A photoconductive member according to claim 1, wherein the substrate is in an endless belt form.

37. A photoconductive member which comprises a substrate for the photoconductive member, and a light receiving layer comprising a first layer (I) exhibiting photoconductivity provided on the substrate comprising an amorphous material containing silicon atoms, germanium atoms and from 0.01 to 40 atomic percent of at least one of hydrogen atoms or halogen atoms, and a second layer (II) provided on the first layer (I) comprising an amorphous material containing silicon atoms and at least one of carbon atoms and oxygen atoms, the first layer (I) having a layer region (N) containing nitrogen atoms, and the content of nitrogen atoms in the layer thickness direction smoothly and continuously increases toward the second layer (II) from the substrate side wherein the maximum value Cmax of the content C(N) of nitrogen atoms exists at one end surface of layer region (N).

38. A photoconductive member according to claim 37, wherein the first layer (I) contains hydrogen atoms.

39. A photoconductive member according to claim 37, wherein the first layer (I) contains halogen atoms.

40. A photoconductive member according to claim 37, wherein the content of germanium atoms in the layer thickness direction is non-uniform in the first layer (I).

41. A photoconductive member according to claim 37, wherein the content of germanium atoms in the layer thickness direction is uniform in the first layer (I).

42. A photoconductive member according to claim 37, wherein the first layer (I) contains a conductivity-controlling substance (C).

43. A photoconductive member according to claim 42, wherein the conductivity-controlling substance (C) is an atom belonging to Group III of the periodic table.

44. A photoconductive member according to claim 2, wherein the conductivity-controlling substance (C) is an atom belonging to Group V of the periodic table.

45. A photoconductive member according to claim 37, wherein the layer region (N) has, under the region (X), a region (Y) in which the content C (N) continuously increases toward the substrate side.

46. A photoconductive member according to claim 37, wherein maximum value Cmax of the content C of germanium atoms in the layer thickness direction in the first layer (I) is in a layer region within the depth of 5$\mu$ from the end surface on the substrate side of the first layer (I).

47. A photoconductive member according to claim 46, wherein the maximum value Cmax is 1000 atomic ppm or more on the basis of sum total with silicon atoms.

48. A photoconductive member according to claim 37, wherein the content of germanium atoms existing in the first layer (I) is 1 to $9.5 \times 10^5$ atomic ppm on the basis of sum total with silicon atoms.

49. A photoconductive member according to claim 37, wherein the content of nitrogen atoms existing in the layer region (N) is 0.001 to 50 atomic % on the basis of sum total T (SiGe N) of silicon atoms, germanium atoms and nitrogen atoms.

50. A photoconductive member according to claim 37, wherein, when a ratio of thickness To of the layer region (N) to thickness T of the light receiving layer is 2/5 or more, an upper limit to the content of nitrogen atoms existing in the layer region (N) is 30 atomic % or less on the basis of sum total T (SiGe N) of silicon atoms, germanium atoms and nitrogen atoms.

51. A photoconductive member according to claim 37, wherein the layer region (N) has a localized region (B) containing nitrogen atoms in a higher content toward the substrate side and/or toward the free surface side.

52. A photoconductive member according to claim 51, wherein the localized region (B) is provided within the depth of 5$\mu$ from the end surface on the substrate side of light receiving layer.

53. A photoconductive member according the claim 51, wherein the localized region (B) is provided within the depth of 5$\mu$ from the interface between the first layer (I) and the second layer (II).

54. A photoconductive member according to claim 51, wherein the maximum value Cmax of the content C (N) of nitrogen atoms in the localized region (B) is 500 atomic ppm or more.

55. A photoconductive member according to claim 37, wherein the first layer (I) contains a p-type impurity.

56. A photoconductive member according to claim 55, wherein the p-type member is B, Al, Ga or In.

57. A photoconductive member according to claim 55, wherein the content of the p-type impurity is 0.01 to $5 \times 10^4$ atomic ppm.

58. A photoconductive member according to claim 37, wherein the first layer (I) contains an n-type impurity.

59. A photoconductive member according to claim 58, wherein the content of the n-type impurity is 0.01 to $5 \times 10^4$ atomic ppm.

60. A photoconductive member according to claim 37, wherein the first layer (I) has a layer region (PN) containing a conductivity-controlling substance (C) at the end part on the substrate side.

61. A photoconductive member according to claim 60, wherein the content of the substance (C) existing in the layer region (PN) is 0.01 to $5 \times 10^4$ atomic ppm.

62. A photoconductive member according to claim 60, wherein the first layer (I) has a layer region (Z) in contact with the layer region (PN), the layer region (Z) containing a substance controlling conductive characteristics of opposite polarity to that of the substance (C) existing in the layer region (PN).

63. A photoconductive member according to claim 60, wherein the first layer (I) has a layer region (Z) in contact with the layer region (PN), the layer region (Z) containing a substance controlling conductive characteristics of same polarity as that of the substance (C) existing in the layer region (PN) in a smaller content than that of the substance (C) existing in the layer region (PN).

64. A photoconductive member according to claim 37, wherein the first layer (I) contains 0.01 to 40 atomic % of hydrogen atoms.

65. A photoconductive member according to claim 37, wherein the first layer (I) contains 0.01 to 40 atomic % of halogen atoms.

66. A photoconductive member according to claim 37, wherein the first layer (I) contains 0.01 to 40 atomic % of hydrogen atoms and halogen atoms in total.

67. A photoconductive member according to claim 37, wherein the first layer (I) has a layer thickness of 1 to 100μ.

68. A photoconductive member according to claim 37, wherein the layer region (N) contains oxygen atoms.

69. A photoconductive member according to claim 37, wherein the substrate is electroconductive.

70. A photoconductive member according to claim 37, wherein the substrate is electro-insulating.

71. A photoconductive member according to claim 37, wherein the substrate is cylindrical.

72. A photoconductive member according to claim 37, wherein the substrate is in an endless belt form.

73. A photoconductive member according to claim 37, wherein the second layer (II) contains hydrogen atoms.

74. A photoconductive member according to claim 37, wherein the second layer (II) contains halogen atoms.

75. A photoconductive member according to claim 37, wherein the second layer (II) contains hydrogen atoms and halogen atoms.

76. A photoconductive member according to claim 37, wherein the second layer (II) contains $1 \times 10^{-3}$ to 90 atomic % of carbon atoms.

77. A photoconductive member according to claim 37, wherein the second layer (II) has a layer thickness of 0.03 to 30μ.

78. A photoconductive member which comprises a substrate for the photoconductive member and a light receiving layer of layer constitution comprising a layer region (G) comprising an amorphous material containing germanium atoms and from 0.01 to 40 atomic percent of at least one of hydrogen and halogen atoms, and a layer region (S) exhibiting photoconductivity comprising an amorphous material containing silicon atoms and from 1 to 40 atomic percent of at least one of hydrogen and halogen atoms, the layer region (G) and the layer region (S) being provided successively in this order on the substrate, the light receiving layer further having a layer region (N) containing nitrogen atoms, and the layer region (N) having a region in which the content of nitrogen atoms in the layer thickness direction smoothly and continuously increases toward the upper end surface of the light receiving layer wherein the maximum value Cmax of the content C(N) of nitrogen atoms exists at one end surface of layer region (N).

79. A photoconductive member according to claim 78, wherein at least one of the layer region (G) and the layer region (S) contains hydrogen atoms.

80. A photoconductive member according to claim 78, wherein at least one of the layer region (G) and the layer region (S) contains halogen atoms.

81. A photoconductive member according to claim 78, wherein the content of germanium in the layer region (G) is non-uniform.

82. A photoconductive member according to claim 78, wherein the content of germanium atoms in the layer region (G) is uniform.

83. A photoconductive member according to claim 78, wherein the light receiving layer contains a conductivity-controlling substance.

84. A photoconductive member according to claim 83, wherein the conductivity-controlling substance is an atom belonging to Group III of the periodic table.

85. A photoconductive member according to claim 83, wherein the conductivity-controlling substance is an atom belonging to Group V of the periodic table.

86. A photoconductive member according to claim 78, wherein the content of germanium atoms in the layer region (G) is 1 to $1 \times 10^6$ atomic ppm.

87. A photoconductive member according to claim 78, wherein the layer region (G) has a layer thickness $T_B$ of 30 Å to 50μ.

88. A photoconductive member according to claim 78, wherein the layer region (S) has a layer thickness T of 0.5 to 90μ.

89. A photoconductive member according to claim 78, wherein the light receiving layer has a layer thickness of 1 to 100μ.

90. A photoconductive member according to claim 78, wherein a relationship of $T_B/T \leq 1$ exists between the layer thickness $T_B$ of the layer region (G) and the layer thickenss T of the layer region (S).

91. A photoconductive member according to claim 78, wherein, when the content of germanium atoms existing in the layer region (G) is $1 \times 10^5$ atomic ppm or more, the layer thickness $T_B$ of the layer region (G) is 30μ or less.

92. A photoconductive member according to claim 78, wherein maximum value Cmax of the content C of germanium atoms in the layer thickness direction in the layer region (G) is in a layer region within the depth of 5μ from the end surface on the substrate side of the layer region (G).

93. A photoconductive member according to claim 92, wherein the maximum Cmax is 1000 atomic ppm or more on the basis of sum total with silicon atoms.

94. A photoconductive member according to claim 78, wherein the content of nitrogen atoms existing in the layer region (N) is 0.001 to 50 atomic % on the basis of sum total T (SiGe N) of silicon atoms, germanium atoms and nitrogen atoms.

95. A photoconductive member according to claim 78, wherein, when a ratio of thickness To of the layer region (N) to the thickness T of the light receiving layer is 2/5 or more, an upper limit to the content of nitrogen atoms existing in the layer region (N) is 30 atomic % or less on the basis of sum total T (SiGe N) of silicon atoms, germanium atoms and nitrogen atoms.

96. A photoconductive member according to claim 78, wherein the layer region (N) has a localized region (B) containing nitrogen atoms in a higher content toward the substrate side and/or toward the free surface side.

97. A photoconductive member according to claim 96, wherein the localized region (B) is provided within the depth of $5\mu$ from the end surface on the substrate side of the light receiving layer.

98. A photoconductive member according to claim 96, wherein the localized region (B) is provided within the depth of $5\mu$ from the free surface side of the light receiving layer.

99. A photoconductive member according to claim 96, wherein the maximum value Cmax of the content C (N) of nitrogen atoms in the localized region (B) is 500 atomic ppm or more.

100. A photoconductive member according to claim 78, wherein the light receiving layer contains a p-type impurity.

101. A photoconductive member according to claim 100, wherein the p-type impurity is B, Al, Ga, or In.

102. A photoconductive member according to claim 100, wherein the content of p-type inpurity is 0.01 to $5 \times 10^4$ atomic ppm.

103. A photoconductive member according to claim 78, wherein the light receiving layer contains an n-type impurity.

104. A photoconductive member according to claim 103, wherein the content of the n-type impurity is 0.01 to $5 \times 10^4$ atomic ppm.

105. A photoconductive member according to claim 78, wherein the light receiving layer has a layer region (PN) containing a conductivity-controlling substance (C) at the end part on the substrate side.

106. A photoconductive member according to claim 105, wherein the content of the substance (C) existing in the layer region (PN) is 0.01 to $5 \times 10^4$ atomic ppm.

107. A photoconductive member according to claim 105, wherein the light receiving layer has a layer region (Z) in contact with the layer region (PN), the layer region (Z) containing a substance controlling conductive characteristics of opposite polarity to that of the substance (C) existing in the layer region (PN).

108. A photoconductive member according to claim 105, wherein the light receiving layer has a layer region (Z) in contact with the layer region (PN), the layer region (Z) containing a substance controlling conductive characteristics of same polarity as that of the substance (C) existing in the layer region (PN) in a smaller content than that of the substance (C) existing in the layer region (PN).

109. A photoconductive member according to claim 78, wherein the layer region (G) contains 0.01 to 40 atomic % of hydrogen atoms.

110. A photoconductive member according to claim 78, wherein the layer region (G) contains 0.01 to 40 atomic % of halogen atoms.

111. A photoconductive member according to claim 78, wherein the layer region (G) contains 0.01 to 40 atomic % of hydrogen atoms and halogen atoms in total.

112. A photoconductive member according to claim 78, wherein the light receiving layer has a layer thickness of 1 to $100\mu$.

113. A photoconductive member according to claim 78, wherein the layer region (N) contains oxygen atoms.

114. A photoconductive member according to claim 78, wherein the substrate is electroconductive.

115. A photoconductive member according to claim 78, wherein the stubstrate is electro-insulating.

116. A photoconductive member according to claim 78, wherein the substrate is cylindrical.

117. A photoconductive member according to claim 78, wherein the substrate is in an endless belt form.

118. A photoconductive member which comprises a substrate for the photoconductive member, and a light receiving layer comprising a first layer (I) having a first layer region (G) provided on the substrate comprising an amorphous material containing germanium atoms and from 0.01 to 40 atomic percent of at least one of hydrogen atoms and halogen atoms, and a second layer region (S) exhibiting photoconductivity provided on the first layer region (G) comprising an amorphous material containing silicon atoms and from 1 to 40 atomic percent of at least one of hydrogen atoms and halogen atoms and a second layer (II) provided on the first layer (I) comprising an amorphous material containing silicon atoms and at least one of carbon atoms and oxygen atoms, the first layer (I) having a layer region (N) containing nitrogen atoms, and the layer region (N) having a region (X) in which the content C (N) of nitrogen atoms in the layer thickness direction smoothly and continuously increases to the second layer (II) from the substrate side wherein the maximum value Cmax of the content C(N) of nitrogen atoms exists at one end surface of layer region (N).

119. A photoconductive member according to claim 118, wherein the first layer (I) contains hydrogen atoms.

120. A photoconductive member according to claim 118, wherein the first layer (I) contains halogen atoms.

121. A photoconductive member according to claim 118, wherein the content of germanium atoms in the layer thickness direction in the first layer (I) is non-uniform.

122. A photoconductive member according to claim 118, wherein the content of germanium atoms in the layer thickness direction in the first layer (I) is uniform.

123. A photoconductive member according to claim 118, wherein the first layer (I) contains a conductivity-controlling substance.

124. A photoconductive member according to claim 123, wherein the conductivity-controlling substance (C) is an atom belonging to Group III of the periodic table.

125. A photoconductive member according to claim 123, wherein the conductivity-controlling substance (C) is an atom belonging to Group V of the periodic table.

126. A photoconductive member according to claim 118, wherein the layer region (N) has, under the region (X), a region (Y) in which the content C (N) continuously increases toward the substrate side.

127. A photoconductive member according to claim 118, wherein maximum value Cmax of the content C of germanium atoms in the layer direction in the first layer (I) is in a layer region within the depth of $5\mu$ from the end surface on the substrate side of the first layer (I).

128. A photoconductive member according to claim 127, wherein the maximum value Cmax is 1000 atomic ppm or more on the basis of sum total with silicon atoms.

129. A photoconductive member according to claim 118, wherein the content of germanium atoms existing in the first layer (I) is 1 to $9.5 \times 10^5$ atomic ppm on the basis of sum total with silicon atoms.

130. A photoconductive member according to claim 118, wherein the content of nitrogen atoms existing in the layer region (N) is 0.001 to 50 atomic % on the basis of sum total T (SiGe N) of silicon atoms, germanium atoms and nitrogen atoms.

131. A photoconductive member according to claim 118, wherein, when a ratio of thickness $T_o$ of the layer region (N) to thickness T of the light receiving layer is 2/5 or more, an upper limit to the content of nitrogen atoms existing in the layer region (N) is 30 atomic % or less on the basis of sum total T (SiGe N) of silicon atoms, germanium atoms, and nitrogen atoms.

132. A photoconductive member according to claim 118, wherein the layer region (N) has a localized region (B) in which nitrogen atoms are contained in a higher content toward the substrate side and/or toward the free surface side.

133. A photoconductive member according to claim 132, wherein the localized region (B) is provided within the depth of $5\mu$ from the end surface on the substrate side of the light receiving layer.

134. A photoconductive member according to claim 132, wherein the localized region (B) is provided within the thickness of $5\mu$ from the interface between the first layer (I) and the second layer (II).

135. A photoconductive member according to claim 132, wherein the maximum value Cmax of the content C (N) of nitrogen atoms in the localized region (B) is 500 atomic ppm or more.

136. A photoconductive member according to claim 118, wherein the first layer (I) contains a p-type impurity.

137. A photoconductive member according to claim 136, wherein the p-type impurity is B, Al, Ga, or In.

138. A photoconductive member according to claim 136, wherein the content of the p-type impurity is 0.01 to $5 \times 10^4$ atomic ppm.

139. A photoconductive member according to claim 118, wherein the first layer (I) contains an n-type impurity.

140. A photoconductive member according to claim 139, wherein the content of the n-type impurity is 0.01 to $5 \times 10^4$ atomic ppm.

141. A photoconductive member according to claim 118, wherein the first layer (I) has a layer region (PN) containing a conductivity-controlling substance (C) at the end part on the substrate side.

142. A photoconductive member according to claim 141, wherein the content of the substance (C) existing in the layer region (PN) is 0.01 to $5 \times 10^4$ atomic ppm.

143. A photoconductive member according to claim 141, wherein the first layer (I) has a layer region (Z) in contact with the layer region (PN), the layer region (Z) containing a substance controlling conductive characteristics of opposite polarity to that of the substance (C) existing in the layer region (PN).

144. A photoconductive member according to claim 141, wherein the first layer (I) has a layer region (Z) in contact with the layer region (PN), the layer region (Z) containing a substance controlling conductive characteristics of same polarity as that of the substance existing in the layer region (PN) in a smaller content than that of the substance (C) existing in the layer region (PN).

145. A photoconductive member according to claim 118, wherein the first layer (I) contains 0.01 to 40 atomic % of hydrogen atoms.

146. A photoconductive member according to claim 118, wherein the first layer (I) contains 0.01 to 40 atomic % of halogen atoms.

147. A photoconductive member according to claim 118, wherein the first layer (I) contains 0.01 to 40 atomic % of hydrogen atoms and halogen atoms in total.

148. A photoconductive member according to claim 118, wherein the first layer (I) has a layer thickness of 1 to $100\mu$.

149. A photoconductive member according to claim 118, wherein the layer region (N) contains oxygen atoms.

150. A photoconductive member according to claim 118, wherein the substrate is electroconductive.

151. A photoconductive member according to claim 118, wherein the substrate is electro-insulating.

152. A photoconductive member according to claim 118, wherein the substrate is cylindrical.

153. A photoconductive member according to claim 118, wherein the substrates in an endless belt form.

154. A photoconductive member according to claim 118, wherein the second layer (II) contains hydrogen atoms.

155. A photoconductive member according to claim 118, wherein the second layer (II) contains halogen atoms.

156. A photoconductive member according to claim 118, wherein the second layer (II) contains hydrogen atoms and halogen atoms.

157. A photoconductive member according to claim 118, wherein the content of carbon atoms in the second layer (II) is $1 \times 10^{-3}$ to 90 atomic %.

158. A photoconductive member according to claim 118, wherein the second layer (G) has a layer thickness of 0.003 to $30\mu$.

159. A photoconductive member according to claim 2, wherein halogen atoms are contained in the light receiving layer.

160. A photoconductive member according to claim 38, wherein the first layer (I) contains halogen atoms.

161. A photoconductive member according to claim 79, wherein at least one of the layer region (G) and the layer region (S) contains halogen atoms.

162. A photoconductive member according to claim 119, wherein the first layer (I) contains halogen atoms.

163. An electrophotographic process comprising:
(a) applying a charging treatment to a photoconductive member which comprises a substrate for a photoconductive member and a light receiving layer on said substrate comprising an amorphous material comprising silicon atoms and germanium atoms and exhibiting photoconductivity, the light receiving layer containing from 0.01 to 40 atomic percent of at least one of hydrogen atoms and halogen atoms and having a layer region (N) containing nitrogen atoms, and the layer region (N) having a region (X) where the distribution concentration of nitrogen in the direction of layer thickness increases smoothly and continuously toward the upper surface of the light receiving layer, wherein the maximum value Cmax of the content C(N) of nitrogen atoms exists at one end surface of layer region (N); and (b) irradiating the photoconductive member with an electromagnetic wave carrying information, thereby forming an electrostatic image.

164. An electrophotographic process comprising: (a) applying a charging treatment to a photoconductive member which comprises a substrate for a photoconductive member and a light receiving layer comprising a layer region (G) comprising an amorphous material containing germanium atoms and from 0.01 to 40 atomic percent of at least one of hydrogen atoms and halogen atoms and a layer region (S) comprising an amorphous material containing silicon atoms and from 1 to 40 atomic percent of at least one of hydrogen atoms and halogen atoms and exhibiting photoconductivity, the layer region (G) and the layer region (S) being provided in the mentioned order on the substrate, the light receiving layer having a layer region (N) containing nitrogen atoms, and the layer region (N) having a region (X) where the distribution concentration in the direction of layer thickness of nitrogen atoms increases smoothly and continuously toward the upper end surface side of the light receiving layer; wherein the maximum value Cmax of the content C(N) of nitrogen atoms exists at one end surface of layer region (N); and (b) irradiating the photoconductive member with an electromagnetic wave carrying information, thereby forming an electrostatic image.

165. An electrophotographic process comprising:
(a) applying a charging treatment to a photoconductive member which comprises a substrate for a photoconductive member and a light receiving layer comprising a first layer (I) overlying the substrate, comprising an amorphous material containing silicon atoms, germanium atoms and from 0.01 to 40 atomic percent of at least one of hydrogen atoms and halogen atoms and exhibiting photoconductivity and a second layer (II) overlying the first layer and comprising an amorphous material containing silicon atoms and at least one of carbon atoms and oxygen atoms, the first layer (I) having a layer region (N) containing nitrogen atoms, and the layer region (N) having a region (X) where the distribution concentration in the direction of layer thickness of nitrogen atoms increases smoothly and continuously from the substrate side toward the second layer (II), wherein the maximum value Cmax of the content C(N) of nitrogen atoms exists at one end surface of layer region (N); and (b) irradiating the photoconductive member with an electromagnetic wave carrying information, thereby forming an electrostatic image.

166. An electrophotographic process comprising:
(a) applying a charging treatment to a photoconductive member which comprises a substrate for a photoconductive member and a light receiving layer comprising a first layer (I) having a first layer region (G) overlying the substrate and comprising an amorphous material containing germanium atoms and from 0.01 to 40 atomic percent of at least one of hydrogen atoms and halogen atoms, and a second layer region (S) overlying the first layer region (G), comprising an amorphous material containing silicon atoms and from 1 to 40 atomic percent of at least one of hydrogen atoms and halogen atoms and exhibiting photoconductivity, and a second layer (II) overlying the first layer and comprising an amorphous material containing silicon atoms and at least one of carbon atoms and oxygen atoms, the first layer (I) having a layer region (N) containing nitrogen atoms, and the layer region (N) having a region (X) where the distribution concentration in the direction of layer thickness of nitrogen atoms increases smoothly and continuously from the substrate side toward the second layer (II) and wherein the maximum value Cmax of the content C(N) of nitrogen atoms exists at one end surface of layer region (N);
(b) irradiating the photoconductive member with an electromagnetic wave carrying information, thereby forming an electrostatic image.

* * * * *

UNITED STATES PATENT AND TRADEMARK OFFICE
CERTIFICATE OF CORRECTION

PATENT NO. : 4,600,671
DATED : July 15, 1986
INVENTOR(S) : KEISHI SAITOH, ET AL.

It is certified that error appears in the above-identified patent and that said Letters Patent is hereby corrected as shown below:

COLUMN 55
  Line 54, change "direction in" to --direction is--.

COLUMN 60
  Line 65, change "maximum Cmax" to --maximum value Cmax--.

COLUMN 63
  Line 15, change "$T_o$" to --To--.

COLUMN 64
  Line 26, change "substrates in" to --substrate is in--.

TABLE 1B, COLUMN 37
  Line 16, change "$GeF_4$/He = .05" to --$GeH_4$/He = 0.5--.

TABLE 6C, COLUMN 43
  Lines 51 and 52, change "$13\text{-}1\text{-}1C$" to --$13\text{-}1\text{-}1C_{\circ\circ}$--.

TABLE 6C, COLUMN 43
  Lines 53 and 54, change "$13\text{-}1\text{-}2C$" to --$13\text{-}1\text{-}2C_{\circ\circ}$--.

TABLE 6C, COLUMN 43
  Lines 55 and 56, change "$13\text{-}1\text{-}3C$" to --$13\text{-}1\text{-}3C_{\circ\circ}$--.

UNITED STATES PATENT AND TRADEMARK OFFICE
CERTIFICATE OF CORRECTION

PATENT NO. : 4,600,671

DATED : July 15, 1986

INVENTOR(S) : KEISHI SAITOH, ET AL.

It is certified that error appears in the above-identified patent and that said Letters Patent is hereby corrected as shown below:

TABLE 5F, COLUMN 53

Line 23, change "5-6C" to --5-6F--.
Line 26, change "5-7C" to --5-7F--.
Line 29, change "5-8C" to --5-8F--.

Signed and Sealed this

Twenty-eighth Day of April, 1987

Attest:

DONALD J. QUIGG

Attesting Officer

Commissioner of Patents and Trademarks